United States Patent
Patra

(10) Patent No.: US 9,791,785 B2
(45) Date of Patent: Oct. 17, 2017

(54) METHOD FOR ASSIGNING A PUPIL FACET OF A PUPIL FACET MIRROR OF AN ILLUMINATION OPTICAL UNIT OF A PROJECTION EXPOSURE APPARATUS TO A FIELD FACET OF A FIELD FACET MIRROR OF THE ILLUMINATION OPTICAL UNIT

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 158 days.

(21) Appl. No.: 14/669,761

(22) Filed: Mar. 26, 2015

(65) Prior Publication Data

US 2015/0198891 A1   Jul. 16, 2015

Related U.S. Application Data

(63) Continuation of application No. PCT/EP2013/072622, filed on Oct. 29, 2013.
(Continued)

(30) Foreign Application Priority Data

Nov. 13, 2012   (DE) .................... 10 2012 220 596

(51) Int. Cl.
*G03B 27/68*   (2006.01)
*G03F 7/20*   (2006.01)
(Continued)

(52) U.S. Cl.
CPC ............. *G03F 7/702* (2013.01); *G02B 5/09* (2013.01); *G02B 26/0816* (2013.01);
(Continued)

(58) Field of Classification Search
CPC .. G03F 7/70075; G03F 7/70116; G03F 7/702; G03F 7/70233; G02B 26/0816;
(Continued)

(56) References Cited

U.S. PATENT DOCUMENTS 6,859,515 B2   2/2005   Schultz et al.
7,196,841 B2   3/2007   Melzer et al.
(Continued)

FOREIGN PATENT DOCUMENTS

DE           103 29 141 A1   2/2005
DE   10 2006 036 064 A1   2/2008
(Continued)

OTHER PUBLICATIONS

German Office Action, with translation thereof, for corresponding DE Appl No. 10 2012 220 596.9, dated Jun. 10, 2013.
(Continued)

*Primary Examiner* — Peter B Kim
(74) *Attorney, Agent, or Firm* — Fish & Richardson P.C.

(57) ABSTRACT

Methods are disclosed for assigning a pupil facet of a pupil facet mirror of an illumination optical unit of a projection exposure apparatus to a field facet of a field facet mirror of the illumination optical unit for the definition of an illumination channel for a partial beam of illumination light.

21 Claims, 9 Drawing Sheets

Related U.S. Application Data

(60) Provisional application No. 61/725,651, filed on Nov. 13, 2012.

(51) Int. Cl.
    *G02B 26/08*     (2006.01)
    *G02B 5/09*     (2006.01)
    *G02B 27/00*     (2006.01)

(52) U.S. Cl.
    CPC ..... *G02B 26/0833* (2013.01); *G02B 27/0012* (2013.01); *G03F 7/70075* (2013.01); *G03F 7/70116* (2013.01); *G03F 7/70233* (2013.01)

(58) Field of Classification Search
    CPC ... G02B 26/0833; G02B 27/0015; G02B 5/09
    USPC .......................................................... 355/72
    See application file for complete search history.

(56) References Cited

U.S. PATENT DOCUMENTS

| | | | |
|---|---|---|---|
| 2003/0038225 A1* | 2/2003 | Mulder | G03F 7/70116 250/205 |
| 2003/0043455 A1 | 3/2003 | Singer et al. | |
| 2007/0165202 A1* | 7/2007 | Koehler | G03F 7/702 355/67 |
| 2008/0278704 A1 | 11/2008 | Endres et al. | |
| 2009/0091731 A1 | 4/2009 | Ossmann et al. | |
| 2009/0251677 A1 | 10/2009 | Endres et al. | |
| 2011/0001947 A1 | 1/2011 | Dinger et al. | |
| 2011/0063598 A1 | 3/2011 | Fiolka et al. | |
| 2011/0085151 A1 | 4/2011 | Deguenther | |
| 2011/0122392 A1 | 5/2011 | Fiolka et al. | |
| 2011/0164233 A1 | 7/2011 | Staicu et al. | |
| 2012/0287414 A1 | 11/2012 | Fiolka et al. | |

FOREIGN PATENT DOCUMENTS

| | | |
|---|---|---|
| DE | 10 2006 059 024 A1 | 6/2008 |
| DE | 10 2008 041 593 A1 | 4/2009 |
| DE | 10 2008 021 833 A1 | 7/2009 |
| DE | 10 2008 001 511 A1 | 11/2009 |
| DE | 10 2008 002 749 A1 | 12/2009 |
| DE | 10 2009 045 694 A1 | 4/2011 |
| DE | 10 2010 001 388 A1 | 8/2011 |
| EP | 1 225 481 A2 | 7/2002 |
| WO | WO 2009/132756 A1 | 11/2009 |
| WO | WO 2010/037453 A1 | 4/2010 |

OTHER PUBLICATIONS

International Search Report for corresponding PCT Appl. No. PCT/EP2013/072622, dated Mar. 20, 2014.

* cited by examiner

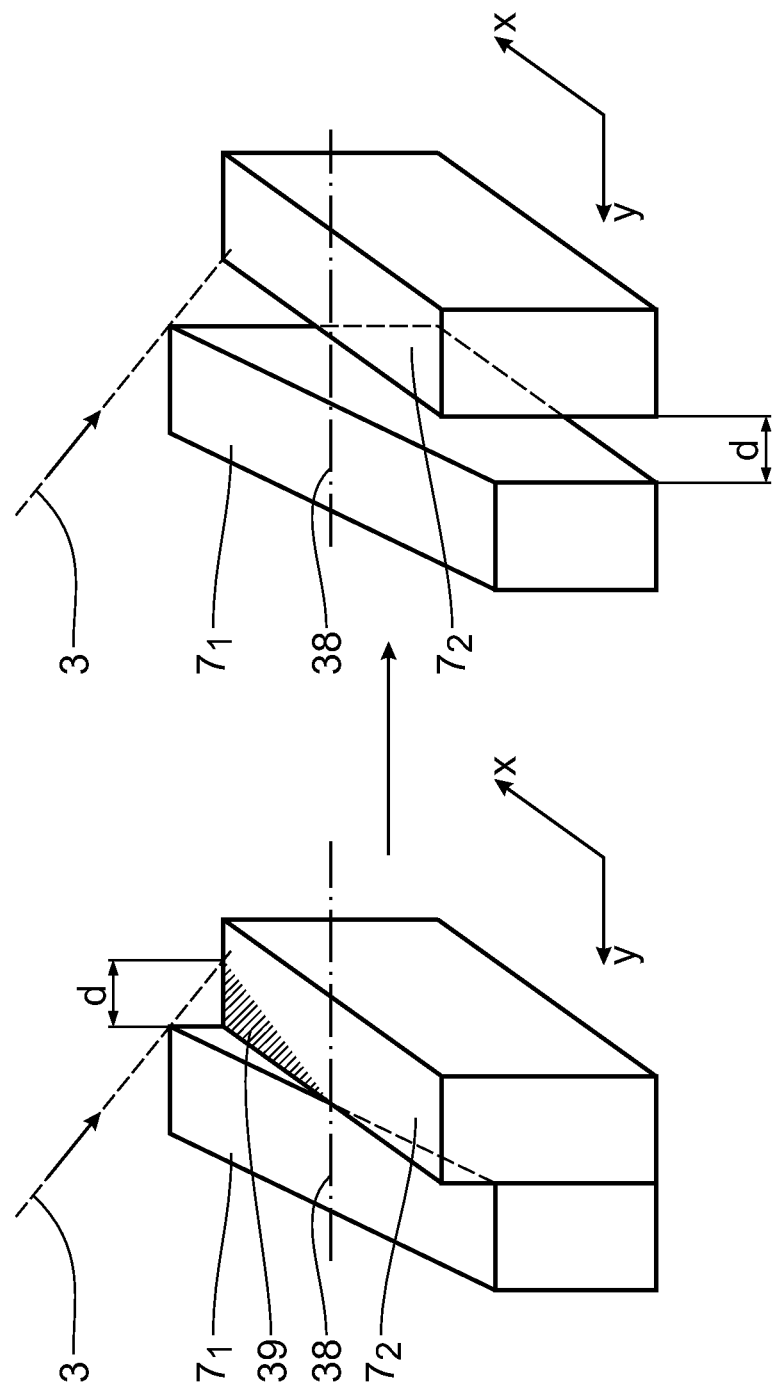

METHOD FOR ASSIGNING A PUPIL FACET OF A PUPIL FACET MIRROR OF AN ILLUMINATION OPTICAL UNIT OF A PROJECTION EXPOSURE APPARATUS TO A FIELD FACET OF A FIELD FACET MIRROR OF THE ILLUMINATION OPTICAL UNIT

CROSS-REFERENCE TO RELATED APPLICATIONS

The present application is a continuation of, and claims benefit under 35 USC 120 to, international application PCT/EP2013/072622, filed Oct. 29, 2013, which claims benefit under 35 USC 119 of German Application No. 10 2012 220 596.9, filed Nov. 13, 2012. International application PCT/EP2013/072622 also claims priority under 35 USC 119(e) to U.S. Provisional Application No. 61/725,651, filed Nov. 13, 2012. The contents of international application PCT/EP2013/072622 and German patent application DE 10 2012 220 596.9 are incorporated by reference.

The invention relates to a method for assigning a pupil facet of a pupil facet mirror of an illumination optical unit of a projection exposure apparatus to a field facet of a field facet mirror of the illumination optical unit for the definition of an illumination channel for a partial beam of illumination light, which, proceeding from a light source, is reflected at the field facet and at the pupil facet assigned via the method toward an object field illuminated by the illumination optical unit. The invention furthermore relates to a computer program for implementing such an assignment method on a computer, a data carrier with such a computer program stored thereon, and a computer with such a computer program implemented thereon.

A projection exposure apparatus comprising an illumination optical unit comprising a field facet mirror and a pupil facet mirror is known from WO 2009/132 756 A1, DE 10 2006 059 024 A1, DE 10 2006 036 064 A1, WO 2010/037 453 A1, DE 10 2008 042 876 A, DE 10 2008 001 511 A1, DE 10 2008 002 749 A1 and DE 10 2009 045 694 A1.

The field facet mirror and the pupil facet mirror of an illumination optical unit of a projection exposure apparatus often have in each case several hundred facets. In the case of an illumination optical unit having N field facets and N pupil facets, in theory the number of possibilities for an assignment of the field facets to the pupil facets scales with N! As the number of facets of the facet mirrors increases, this number of assignment possibilities rapidly becomes vast in magnitude.

It is an object of the present invention to provide an assignment method of the type mentioned in the introduction which, on the basis of an illumination parameter to be optimized, ensures a reproducible selection of an assignment of the pupil facets to the field facets and thus a reproducible predefinition of the illumination channels of the illumination optical unit.

This object is achieved according to the invention via a method for assigning a pupil facet of a pupil facet mirror of an illumination optical unit of a projection exposure apparatus to a field facet of a field facet mirror of the illumination optical unit for the definition of an illumination channel for a partial beam of illumination light, which, proceeding from a light source, is reflected at the field facet and at the pupil facet assigned via the method toward an object field illuminated by the illumination optical unit, comprising the following steps a) to i), wherein of the following determining steps b) to f) only at least one of the determining steps is carried out mandatorily:

a) identifying at least one illumination parameter with which an illumination of the object field can be evaluated,
b) determining a dependence of the illumination parameter on design predefinition data of the optical parameters of the light source and/or of the illumination optical unit,
c) determining a dependence of the illumination parameter on individual-part acceptance data of the optical parameters of the light source and/or of the illumination optical unit,
d) determining a dependence of the illumination parameter on total-system acceptance data of the optical parameters at the location of the production of the light source and/or of the illumination optical unit,
e) determining a dependence of the illumination parameter on calibration data of the optical parameters of the light source and/or of the illumination optical unit at the location of the installation of the projection exposure apparatus,
f) determining a dependence of the illumination parameter on online measurement data of the optical parameters of the light source and/or of the illumination optical unit,
g) predefining an illumination-channel-dependent evaluation function for evaluating a possible illumination channel group, that is to say a possible combination of exactly one of the field facets with exactly one disjoint set of pupil facets for guiding the partial beam of the illumination light, depending on the selected illumination parameter,
h) predefining an evaluation target range of evaluation variables as a result of the evaluation function,
i) selecting those illumination channels whose evaluation variable remains within the evaluation target range.

According to the invention it has been recognized that what is of importance is specifying a suitable evaluation function into which the influence of properties of the beam guiding via an individual illumination channel on the illumination parameter to be considered is incorporated. The assignment method makes possible an assignment of all illumination channels of an illumination optical unit with field facets and pupil facets with an identified, optimized illumination parameter. The method can be flexibly adapted to the respective illumination task. This adaptation is effected by selecting the illumination parameter to be considered and by selecting and adapting the evaluation function to be predefined, for example by inserting weighting terms, and by predefining the evaluation target range.

Design predefinition data, that is to say desired values for a production process in particular of main components of the projection exposure apparatus, that is to say a light source, an illumination optical unit and a projection optical unit, are incorporated into the assignment method. Expressed in a simplified way, the design predefinition data are specification data which are recorded in a data sheet before the production of the main components of the projection exposure apparatus. Furthermore, the individual acceptance data, that is to say the set-up values of the components of the projection exposure apparatus that are actually achieved during production, e.g. measurement data for a reflection surface shape (figure) or for a mirror reflectivity which result during a component or individual-part acceptance, are incorporated into the assignment method. Furthermore, total acceptance data, that is to say those data which are ascertained during an acceptance of the entire projection exposure apparatus after the assembly thereof, are incorporated into the assignment method. Furthermore, calibration data, that is to say measurement data which specify a concrete used configuration of the projection exposure apparatus, a so-called set-up, are incorporated into the assignment method. Finally, online measurement data, that is to say the current measurement values which characterize an actual state of the light source, the illumination optical unit and, if appropriate, a projection optical unit, are incorporated into the assignment method.

Of these different data sets, that is to say the design predefinition data, the individual-part acceptance data, the total-system acceptance data, the calibration data and the online measurement data, not necessarily all of the data sets have to be incorporated into the assignment method. Depending on the requirements made with regard to quality and/or handlability of the assignment method, just a single data set or some of these data sets can also be used. The assignment method can therefore flexibly take account of the originally predefined design, the component quality achieved during production, the assembly quality achieved during construction, the set-up currently used, and the current actual state of the projection exposure apparatus. Further data, for example data concerning the object which is intended to be imaged by the projection exposure apparatus, or data concerning the substrate, or wafer, onto which the object is intended to be imaged, can also be incorporated into the assignment method.

The method can include predefining an arrangement of the pupil facets of the pupil facet mirror and/or predefining an arrangement of the field facets of the field facet mirror when selecting the illumination channels. When such predefining an arrangement of the pupil facets and/or of the field facets, it is possible to predefine a size of the facets and/or a position of the facets with respect to one another on the respective facet mirror and/or a radius of curvature of the facets. Such an arrangement predefinition for the facets can be effected in particular if the facet mirror is embodied as an MEMS mirror array. Part of a facet arrangement predefinition may be a balancing of the number of field facets with the number of available pupil facet sets.

The method can include the following steps: predefining groups of pupil facets on the pupil facet mirror onto which, proceeding from different field facets, the illumination light can be deflected for predefining an illumination angle distribution for an illumination of the object field; and assigning the field facets to the pupil facets whilst correspondingly predefining arrangements of sets of the pupil facets which are assigned to different tilting positions of one and the same field facet in such a way that exclusively pupil facets of different pupil facet sets are arranged in each pupil facet group. Such a pupil facet predefinition can be performed on the basis of predefined illumination settings, that is to say on the basis of a predefined illumination angle distribution for the object illumination. The predefined illumination settings can be standard illumination settings and/or customer specific illumination settings. As soon as a plurality of illumination settings are used for the group predefinition of the pupil facets, a prioritization can be brought about between these illumination settings, in particular by the inclusion of weighting terms.

A weighted sum of an illumination intensity of the pupil facets within at least one pupil facet environment around at least one selected pupil facet can be used for the evaluation function. Such an evaluation function makes it possible to predefine an evaluation function independently of the illumination setting. In particular, it is possible to use different pupil facet environments for generating different illumination intensity sums, for example an environment for which exclusively nearest neighbors of the selected pupil facet are considered and an environment for which more distant neighbors of the selected pupil facet are also considered. Weighting factors can be included in the summation of the illumination intensities. Shadings, in particular between neighboring facets, can be taken into account by the inclusion of tilting angles of the neighboring facets.

The method can include predefining radii of curvature for the pupil facets of the pupil facet mirror for preparing for selecting the illumination channels. The method can include predefining a z position of the pupil facets relative to an arrangement plane of the pupil facets on a carrier plate of the pupil facet mirror for preparing for selecting the illumination channels. Such predefinitions have proved to be particularly suitable for optimizing an illumination channel assignment. Alternatively or additionally, it is also possible to predefine radii of curvature for the field facets of the field facet mirror and/or z positions of the field facets of the field facet mirror in the context of the assignment method.

The method can include predefining a set of tilting angles of the pupil facets which results from the illumination channel selecting. The method can include predefining a set of tilting angles of the field facets which results from the illumination channel selecting. Such predefinition of a set of tilting angles can be converted directly into control signals for an actuator-based tilting angle driving of the field facets and/or pupil facets.

The method can include providing a data set which assigns the following data to each field point of the object field: distribution of the illumination angles which illuminate the field point; and illumination intensities at the respective illumination angles. The method can include providing a data set having the following content: pupil facet sets as a result of the assignment method; tilting data of tiltable field facets which, depending on tilting angle, guide a partial beam of the illumination light toward a predefined pupil facet, including the data concerning the set of those pupil facets to which the partial beam can be applied via the tilting angles of exactly one field facet; for each possibility of the tilting settings of the field facets, the distribution of the illumination angles for each field point which illuminate the field point; and illumination intensities at the respective illumination angles. Such a data set can quantitatively describe, for a given illumination channel assignment, the illumination settings possible therewith. A set of illumination settings which fulfill predefined requirements can then be selected therefrom. It is also possible to compare the illumination settings of the data set with predefined setting desired values.

A method for coordinating an illumination system with an object structure to be imaged by a projection exposure apparatus, wherein the illumination system includes a light source and an illumination optical unit, can include the following steps: characterizing the object structure; and carrying out the assignment method described above, depending on the object structure to be predefined. Such a coordinating method can initially be carried out without predefining an illumination setting. In this case, illumination channel assignments are performed which prove to be particularly suitable for the imaging of the characterized object structure. In this case, the suitability is determined by the respective evaluation function. An illumination setting arises as a result during this coordinating method.

A method for coordinating an illumination system with an object structure to be imaged by a projection exposure apparatus, wherein the illumination system includes a light source and an illumination optical unit, can include the following steps: selecting an illumination setting to be predefined; and carrying out the assignment method described above, depending on the illumination setting to be predefined. Such a coordinating method can be carried out in the case of an object structure to be imaged which is still unknown at the time of the method. The illumination setting to be predefined can have extensive regions in an illumination pupil which are covered by pupil facet groups. Alternatively or additionally, the illumination setting to be predefined can comprise individual pupil facets to which illumination light is to be applied and the nearest neighbors of which are unilluminated.

A method for coordinating an illumination system with an object structure to be imaged by a projection exposure apparatus, wherein the illumination system includes a light source and an illumination optical unit, can include the following steps: characterizing the object structure; selecting an illumination setting to be predefined, depending on the object structure characterization; and carrying out the assignment method described above, depending on the illumination setting to be predefined. A data carrier can include a computer program stored thereon for implementing the methods described above. A computer can include a computer program implemented thereon for implementing the methods described above. The advantages of such a method, such a data carrier and such a computer correspond to those which have already been explained above with reference to the assignment method and/or coordinating method.

A stability of the evaluation variable for an illumination channel to be evaluated can be considered depending on a predefined disturbance. Such an assignment method enables an assignment of all illumination channels of an illumination optical unit with field facets and pupil facets with optimized stability. This adaptation is additionally effected by selecting and adapting the disturbance variable respectively used, and predefining the disturbance variable variation range.

The evaluation variable can be precalculated for at least selected illumination channels from the possible illumination channels on the basis of the predefined evaluation function before the actual selection of the illumination channel. In this way, a preselection of possible target configurations of illumination channels can be made with lower computational complexity. Configurations unsuitable from the outset, in particular, can be ruled out via a preselection. By way of example, symmetry considerations can be incorporated into the preselection, such that, by way of example, during the assignment method, firstly configurations which have specific symmetry properties are checked on the basis of the evaluation function. Such configurations can be used, in particular, as start configurations for the disturbance variable variation.

Exemplary embodiments of the invention are explained in greater detail below with reference to the drawing, in which.

Figure 1:
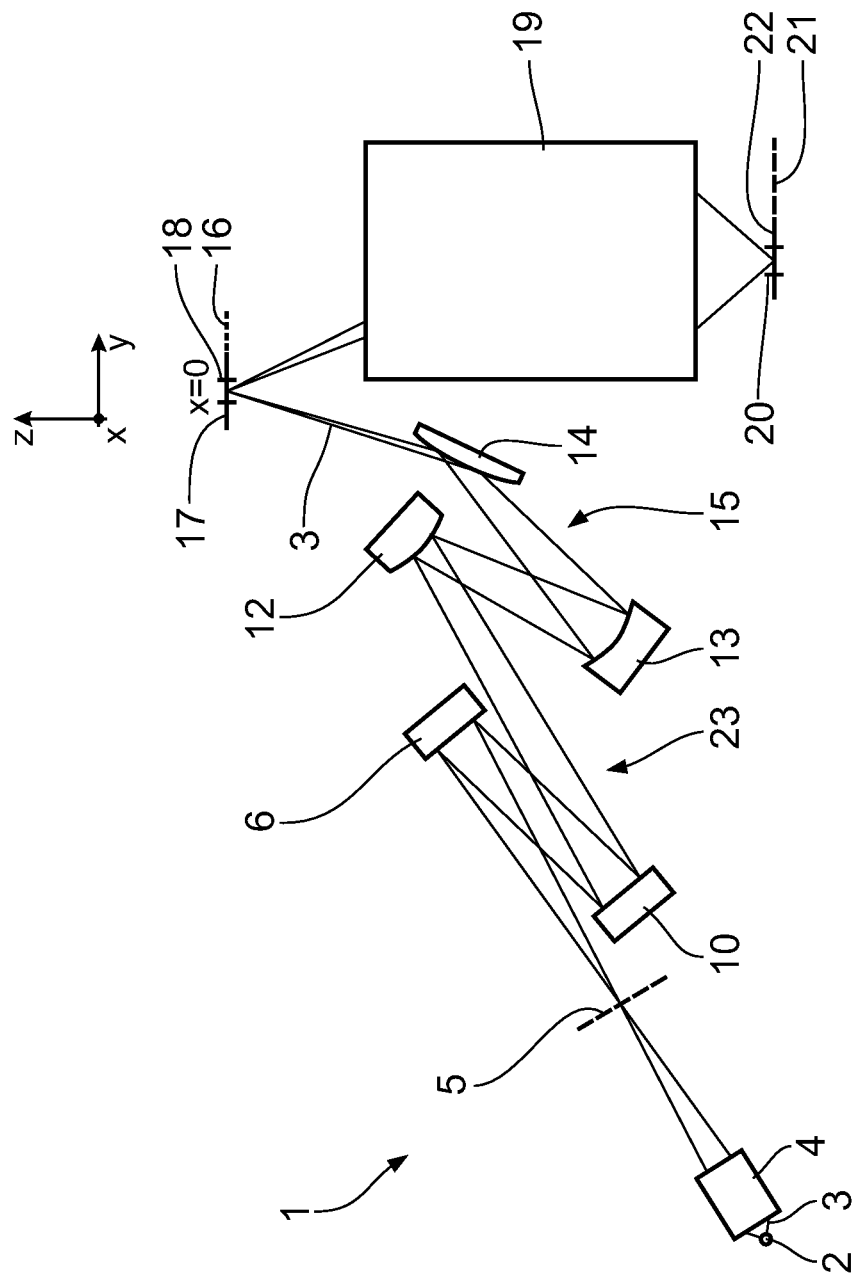
FIG. 1 shows a projection exposure apparatus for microlithography schematically and with regard to an illumination optical unit in meridional section.
Figure 2:
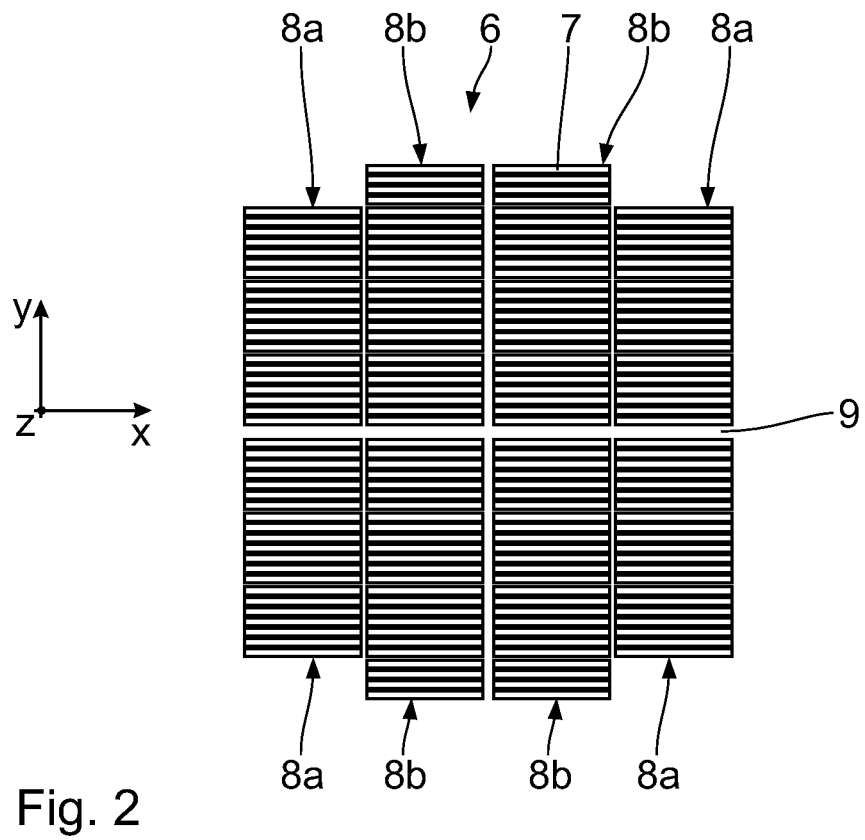
FIG. 2 shows a plan view of a facet arrangement of a field facet mirror of the illumination optical unit of the projection exposure apparatus according to FIG. 1.
Figure 9:
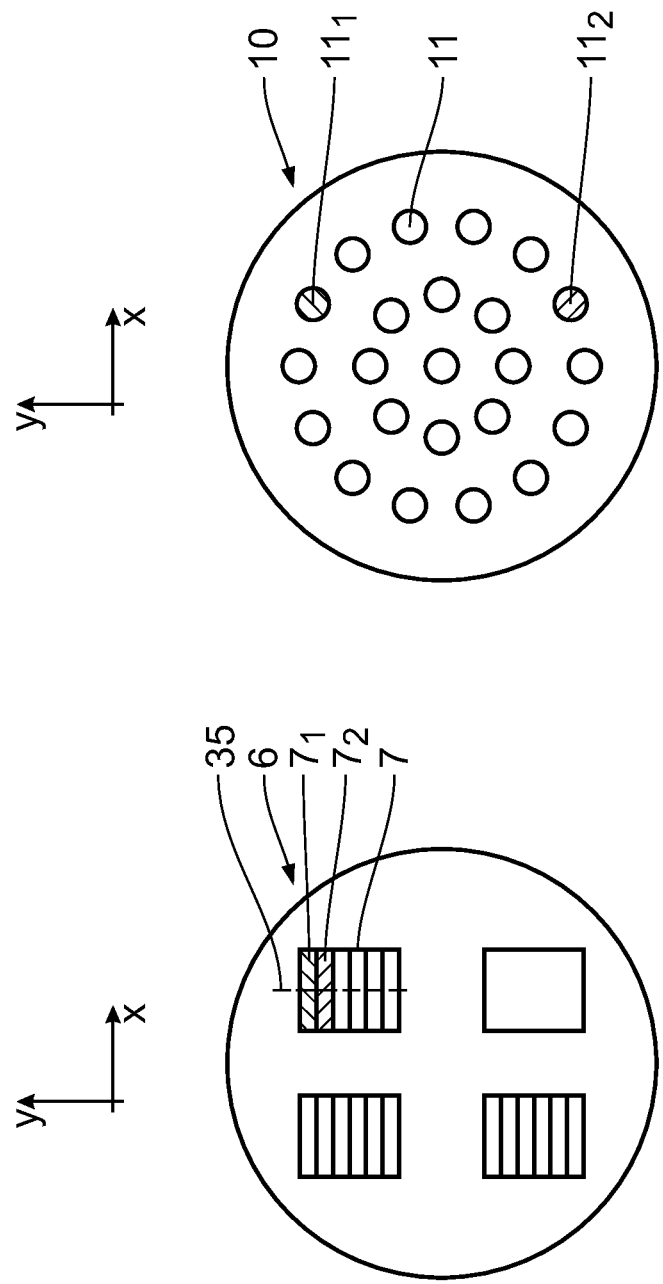
Figure 10:
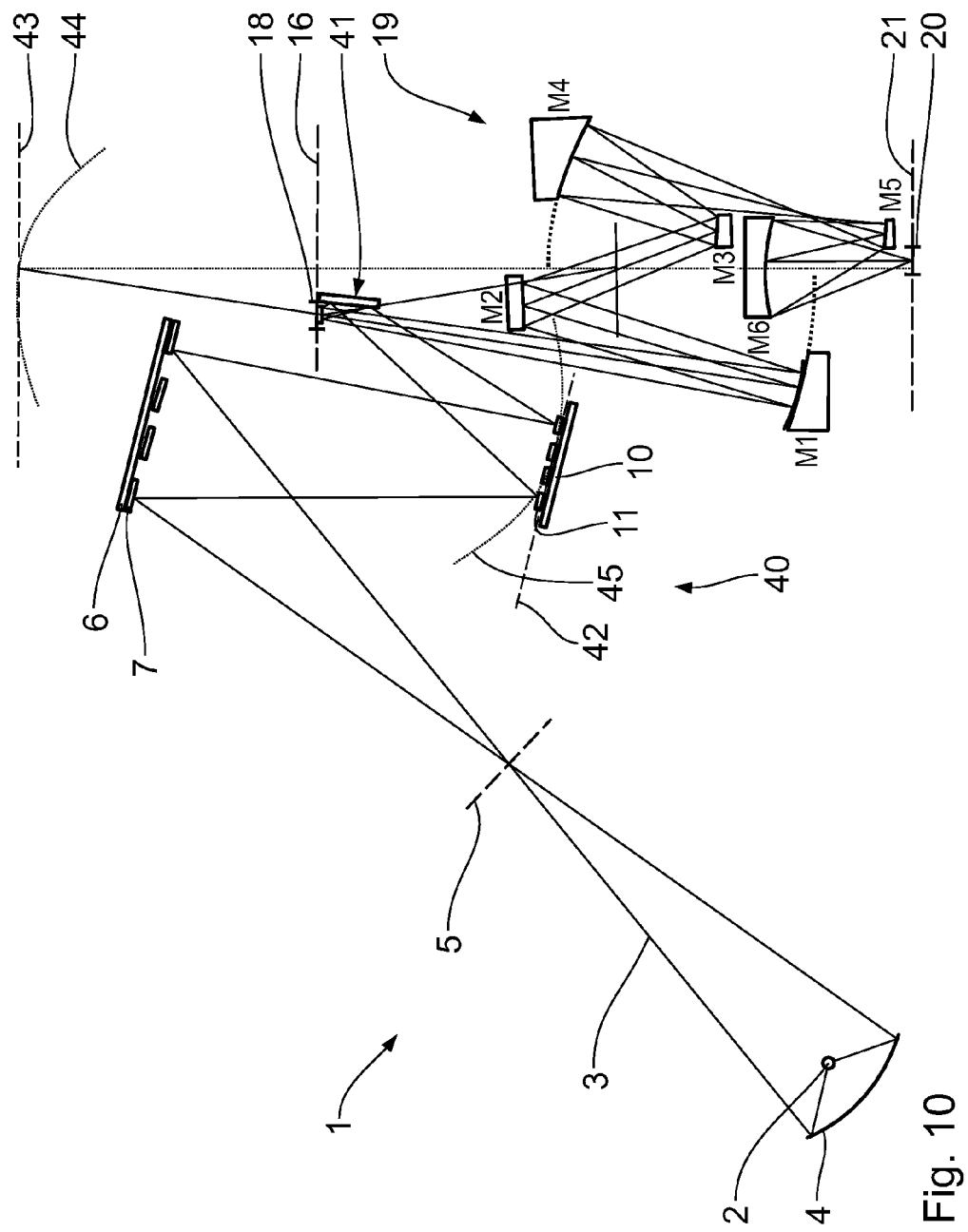
Figure 11:
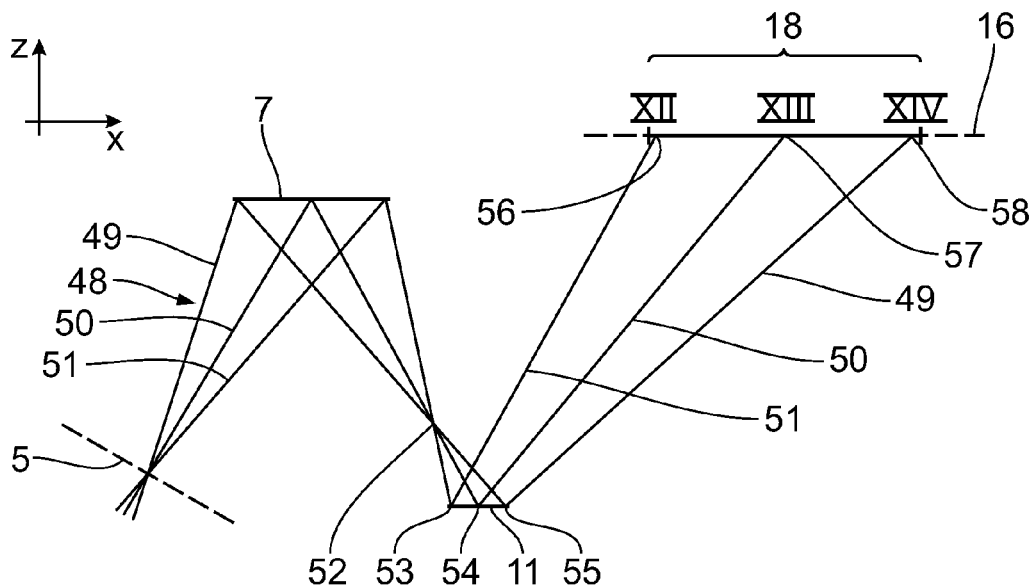
Figure 12:
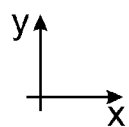
Figure 13:
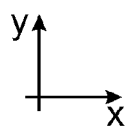
Figure 14:
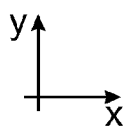

FIG. 7 perspectively shows two neighboring field facets—tilted relative to one another—of the field facet mirror in the embodiment according to FIG. 2, which directly adjoin one another over a long facet side;

FIG. 8 shows the two field facets according to FIG. 7, arranged in such a way that an interspace remains between the long facet sides;

FIG. 9 shows highly schematically on the left a field facet mirror and on the right a pupil facet mirror of the illumination optical unit comprising two pupil and field facets respectively assigned to one another for the definition of an illumination channel;

FIG. 10 shows, in an illustration similar to FIG. 1, a further embodiment of an illumination optical unit of the projection exposure apparatus;

FIG. 11 shows, in an illustration which is highly schematic and not true to scale, ray guiding along an illumination channel comprising exactly one field facet and exactly one pupil facet of the illumination optical unit according to FIG. 1 between an intermediate focus and an object field in a side view corresponding to FIG. 1;

FIG. 12 shows the pupil facet according to FIG. 11, to which an EUV partial beam is applied via the illumination channel, as viewed from the location XII of the object field;

FIG. 13 shows the pupil facet according to FIG. 11, to which an EUV partial beam is applied via the illumination channel, as viewed from the location XIII of the object field; and FIG. 14 shows the pupil facet according to FIG. 11, to which an EUV partial beam is applied via the illumination channel, as viewed from the location XIV of the object field.

A projection exposure apparatus 1 for microlithography serves for producing a micro- or nanostructured electronic semiconductor component. A light source 2 emits EUV radiation used for illumination in the wavelength range of, for example, between 5 nm and 30 nm. The light source 2 can be a GDPP (Gas Discharge Produced Plasma) source or an LPP (Laser Produced Plasma) source. A radiation source based on a synchrotron can also be used for the light source 2. Information about such a light source can be found by the person skilled in the art for example in U.S. Pat. No. 6,859,515 B2. EUV illumination light or illumination radiation 3 is used for illumination and imaging within the projection exposure apparatus 1. The EUV illumination light 3, downstream of the light source 2, firstly passes through a collector 4, which can be, for example, a nested collector having a multi-shell construction known from the prior art, or alternatively an ellipsoidally shaped collector. A corresponding collector is known from EP 1 225 481 A2. Downstream of the collector 4, the EUV illumination light 3 firstly passes through an intermediate focal plane 5, which can be used for separating the EUV illumination light 3 from undesirable radiation or particle portions. After passing through the intermediate focal plane 5, the EUV illumination light 3 firstly impinges on a field facet mirror 6.

In order to facilitate the description of positional relationships, a Cartesian global xyz coordinate system is in each case depicted in the drawing. In FIG. 1, the x-axis runs perpendicularly to the plane of the drawing and out of the latter. The y-axis runs toward the right in FIG. 1. The z-axis runs upwards in FIG. 1.

In order to facilitate the description of positional relationships for individual optical components of the projection exposure apparatus 1, a Cartesian local xyz or xy coordinate system is in each case also used in the following figures. The respective local xy coordinates span, unless described otherwise, a respective principal arrangement plane of the optical component, for example a reflection plane. The x-axes of the global xyz coordinate system and of the local xyz or xy coordinate systems run parallel to one another. The respective y-axes of the local xyz or xy coordinate systems are at an angle with respect to the y-axis of the global xyz coordinate system which corresponds to a tilting angle of the respective optical component about the x-axis.

FIG. 2 shows by way of example a facet arrangement of field facets 7 of the field facet mirror 6. The field facets 7 are rectangular and in each case have the same x/y aspect ratio. The x/y aspect ratio can for example be 12/5, can be 25/4 or can be 104/8.

The field facets 7 predefine a reflection surface of the field facet mirror 6 and are grouped into four columns each of six to eight field facet groups 8a, 8b. The field facet groups 8a in each case have seven field facets 7. The two additional marginal field facet groups 8b of the two central field facet columns in each case have four field facets 7. Between the two central facet columns and between the third and fourth facet rows, the facet arrangement of the field facet mirror 6 has interspaces 9 in which the field facet mirror 6 is shaded by holding spokes of the collector 4.

In a variant which is not illustrated, the field facet mirror 6 is constructed as an MEMS mirror array having a multiplicity of tiltable individual mirrors, wherein each of the field facets 7 is formed by a plurality of such individual mirrors. Such a construction of the field facet mirror 6 is known from US 2011/0001947 A1.

Both a radius of curvature of a field facet individual-mirror group of the MEMS mirror array and a radius of curvature of a pupil facet individual-mirror group of the MEMS mirror array can be adapted by displacement of the individual mirrors perpendicularly to a mirror array arrangement plane and corresponding tilting of the individual mirrors, as likewise described in US 2011/0001947 A1. An adaptation of radius of curvature can also be achieved by the tilting of the individual mirrors without a corresponding displacement perpendicularly to a mirror array arrangement plane, this then effectively resulting in a Fresnel mirror, for example.

After reflection at the field facet mirror 6, the EUV illumination light 3 split into bundles of rays or partial beams which are assigned to the individual field facets 7 impinges on a pupil facet mirror 10.

The field facets 7 of the field facet mirror 6 are tiltable between a plurality of illumination tilting positions, such that a beam path of the illumination light 3 reflected by the respective field facet 7 can thereby be altered in terms of its direction and the impingement point of the reflected illumination light 3 on the pupil facet mirror 10 can thus be altered. Corresponding field facets that can be displaced between different illumination tilting positions are known from U.S. Pat. No. 6,658,084 B2 and U.S. Pat. No. 7,196,841 B2.

Figure 3:
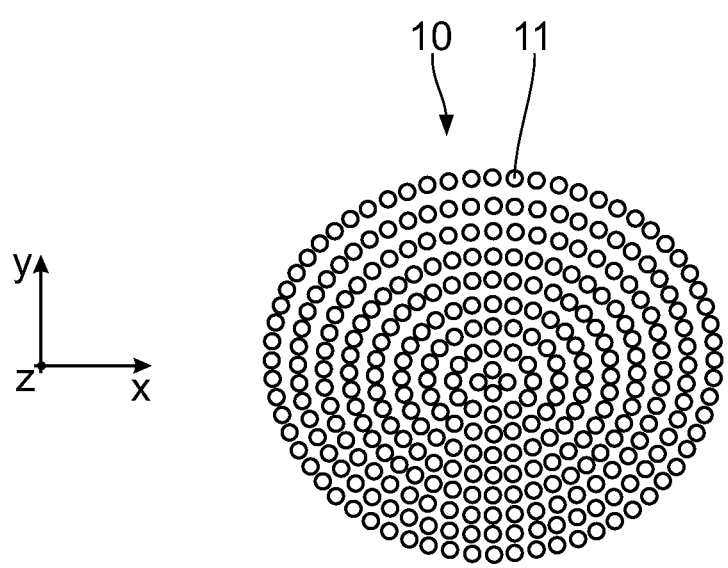
FIG. 3 shows a plan view of a facet arrangement of a pupil facet mirror of the illumination optical unit of the projection exposure apparatus according to FIG. 1.

FIG. 3 shows an exemplary facet arrangement of round pupil facets 11 of the pupil facet mirror 10. The pupil facets 11 are arranged around a center in facet rings lying one inside another. Each partial beam of the EUV illumination light 3 which is reflected by one of the field facets 7 is assigned at least one pupil facet 11 in such a way that a respective impinged-upon facet pair comprising one of the field facets 7 and one of the pupil facets 11 predefines an object field illumination channel for the associated partial beam of the EUV illumination light 3. The channel-wise assignment of the pupil facets 11 to the field facets 7 is effected in a manner dependent on a desired illumination by the projection exposure apparatus 1.

Via the respective illumination tilting positions of the respective field facet 7, the field facet 7 is assigned a disjoint set of pupil facets 11 of the pupil facet mirror 10. The illumination light 3 is applied to each of the pupil facets 11 of one of these sets via exactly one of the different tilting positions of the assigned field facets 7, such that, depending on the tilting position of the field facet 7, a specific illumination channel is formed between the field facet 7 and one of the pupil facets 11 of the pupil facet set. The illumination channels which can be used depending on the tilting position of exactly one of the field facets 7, that is to say via which the illumination light partial beam can be applied to the pupil facets 11 of the disjoint set of pupil facets 11 assigned to the field facet 7, form an illumination channel group. A field facet 7 can have more tilting positions which can be set via an actuator connected to it than tilting positions which lead to the formation of an illumination channel. Only one tilting position which leads to the formation of an illumination channel shall be designated as tilting position hereinafter.

The field facet mirror 6 has several hundred field facets 7, for example 300 field facets 7. The pupil facet mirror 10 has a number of pupil facets 11 that is at least equal in magnitude to the sum of the tilting positions of all the field facets 7 of the field facet mirror 6. In this case, some of the pupil facets are not used for the used assignment of pupil facets to field facets. It is advantageous, in particular, if the sum of the tilting positions of all the field facets 7 of the field facet mirror 6 is equal to the number of pupil facets 11. In a variant which is not illustrated, the pupil facet mirror 10 is constructed as an MEMS mirror array having a multiplicity of tiltable individual mirrors, wherein each of the pupil facets 11 is formed by a plurality of such individual mirrors. Such a construction of the pupil facet mirror 10 is known from US 2011/0001947 A1.

Via the pupil facet mirror 10 (cf. FIG. 1) and a downstream transfer optical unit 15 consisting of three EUV mirrors 12, 13, 14, the field facets 7 are imaged into an object plane 16 of the projection exposure apparatus 1. The EUV mirror 14 is embodied as a mirror for grazing incidence (Grazing-Incidence Mirror). Arranged in the object plane 16 is an object in the form of a reticle 17, which illuminates with the EUV illumination light 3 an illumination region in the form of an illumination field which coincides with an object field 18 of a downstream projection optical unit 19 of the projection exposure apparatus 1. The object field illumination channels are superimposed in the object field 18. The EUV illumination light 3 is reflected from the reticle 17.

The projection optical unit 19 images the object field 18 in the object plane 16 into an image field 20 in an image plane 21. Arranged in the image plane 21 is a wafer 22 bearing a light-sensitive layer, which is exposed during the projection exposure via the projection exposure apparatus 1. During the projection exposure, both the reticle 17 and the wafer 22 are scanned in a synchronized manner in the y-direction. The projection exposure apparatus 1 is embodied as a scanner. The scanning direction y is also designated hereinafter as object displacement direction.

The field facet mirror 6, the pupil facet mirror 10 and the mirrors 12 to 14 of the transfer optical unit 15 are parts of an illumination optical unit 23 of the projection exposure apparatus 1. In a variant of the illumination optical unit 23 which is not illustrated in FIG. 1, the transfer optical unit 15 can also be partly or wholly omitted, such that no further EUV mirror, exactly one further EUV mirror or else exactly two further EUV mirrors can be arranged between the pupil facet mirror 10 and the object field 18. The pupil facet mirror 10 can be arranged in an entrance pupil plane of the projection optical unit 19.

Together with the projection optical unit 19, the illumination optical unit 23 forms an optical system of the projection exposure apparatus 1.

The field facet mirror 6 constitutes a first facet mirror of the illumination optical unit 23. The field facets 7 constitute first facets of the illumination optical unit 23.

The pupil facet mirror 10 constitutes a second facet mirror of the illumination optical unit 23. The pupil facets 11 constitute second facets of the illumination optical unit 23.

Figure 4:
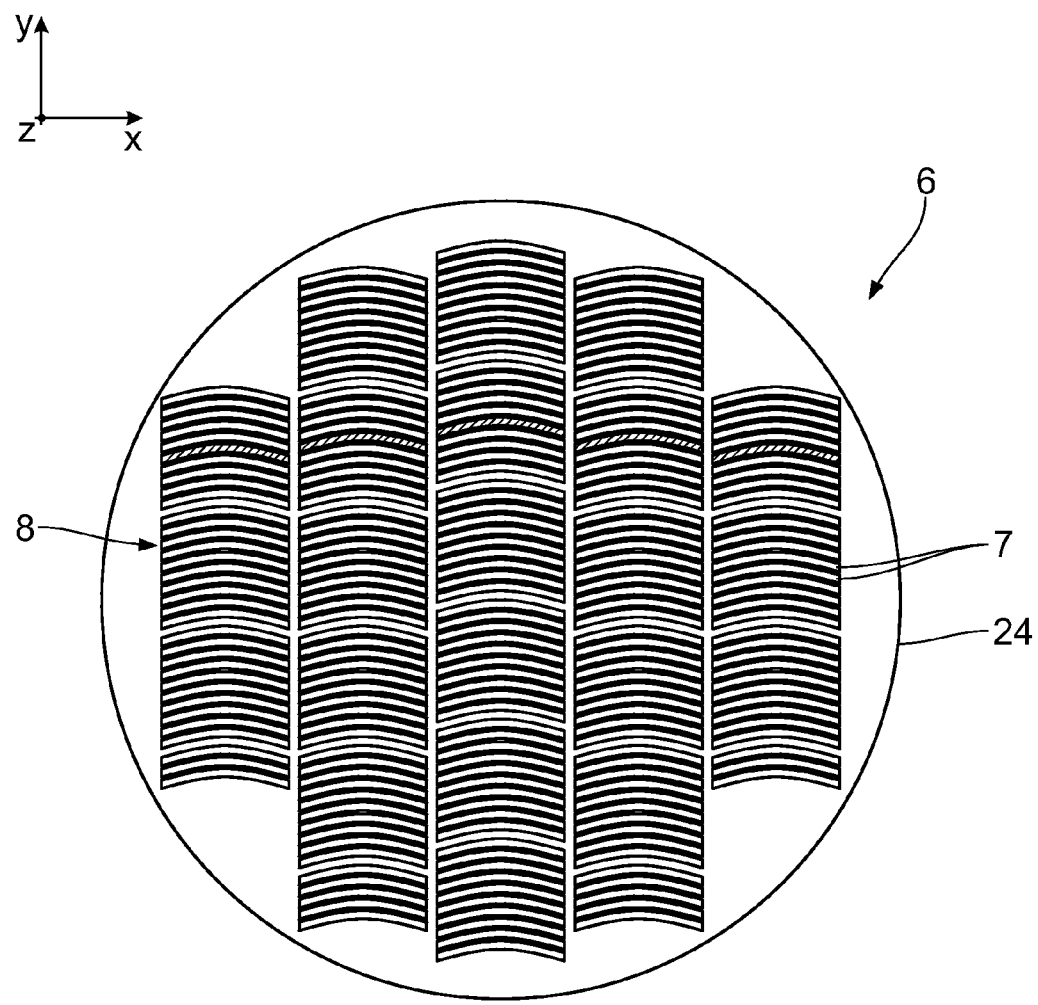
FIGS. 4 and 5 show, in each case in an illustration similar to FIG. 2, facet arrangements of further embodiments of field facet mirrors.

FIG. 4 shows a further embodiment of a field facet mirror 6. Components corresponding to those which have been explained above with reference to the field facet mirror 6 according to FIG. 2 bear the same reference numerals and are only explained in so far as they differ from the components of the field facet mirror 6 according to FIG. 2. The field facet mirror 6 according to FIG. 4 has a field facet arrangement comprising curved field facets 7. These field facets 7 are arranged in a total of five columns each having a plurality of field facet groups 8. The field facet arrangement is inscribed in a circular boundary of a carrier plate 24 of the field facet mirror 6.

The field facets 7 of the embodiment according to FIG. 4 all have the same surface area and the same ratio of width in the x-direction and height in the y-direction which corresponds to the x/y aspect ratio of the field facets 7 of the embodiment according to FIG. 2.

Figure 5:
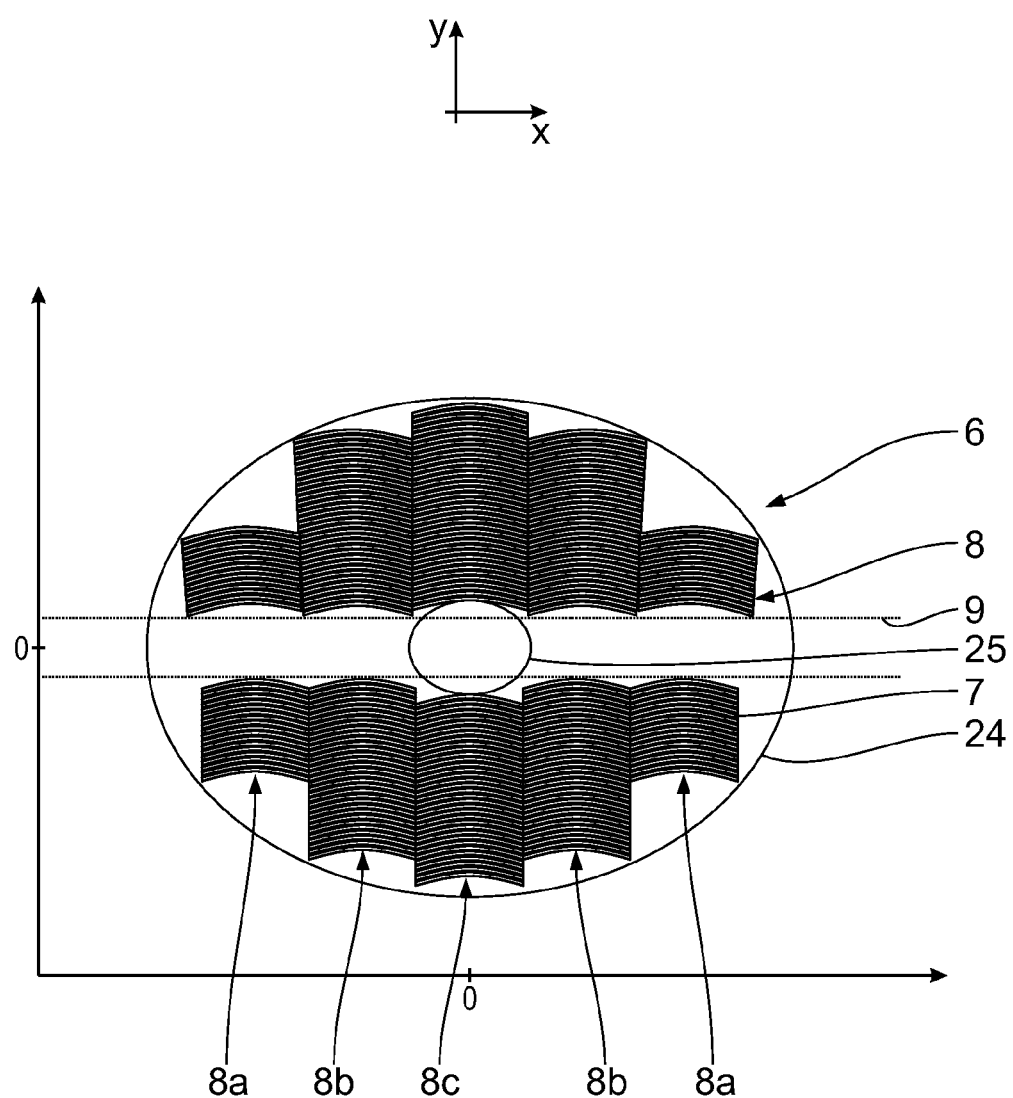

FIG. 5 shows a further embodiment of a field facet mirror 6. Components corresponding to those which have been explained above with reference to the field facet mirrors 6 according to FIGS. 2 and 4 bear the same reference numerals and are only explained in so far as they differ from the components of the field facet mirror 6 according to FIGS. 2 and 4. The field facet mirror 6 according to FIG. 5 likewise has a field facet arrangement having curved field facets 7. The field facets 7 are arranged in a total of five columns each having a plurality of field facet groups 8a, 8b, 8c. The field facet arrangement, in a manner similar to the arrangement of the field facets 7 according to FIG. 4, is inscribed in a circular boundary of a carrier plate 24 of the field facet mirror 6 according to FIG. 5. The field facet mirror 6 according to FIG. 5 once again has a central interspace 9 running parallel to the x-axis, in which interspace the field facet mirror 6 according to FIG. 5 is shaded by holding spokes of the collector 4. In addition, the two illumination zones within which the field facets 7 of the field facet mirror 6 according to FIG. 5 are arranged, in the region of the central facet column having the field facet groups 8c toward the center of the field facet mirror 6, are delimited by a further circular shading surface 25, in which the field facet mirror 6 is shaded centrally.

Overall, the field facets 7 of the field facet mirror 6 according to FIG. 5 are packed within two approximately circle-segment-shaped illumination zones predefined firstly by the boundary of the carrier plate 24 and secondly by the boundary of the interspace 9.

Figure 6:
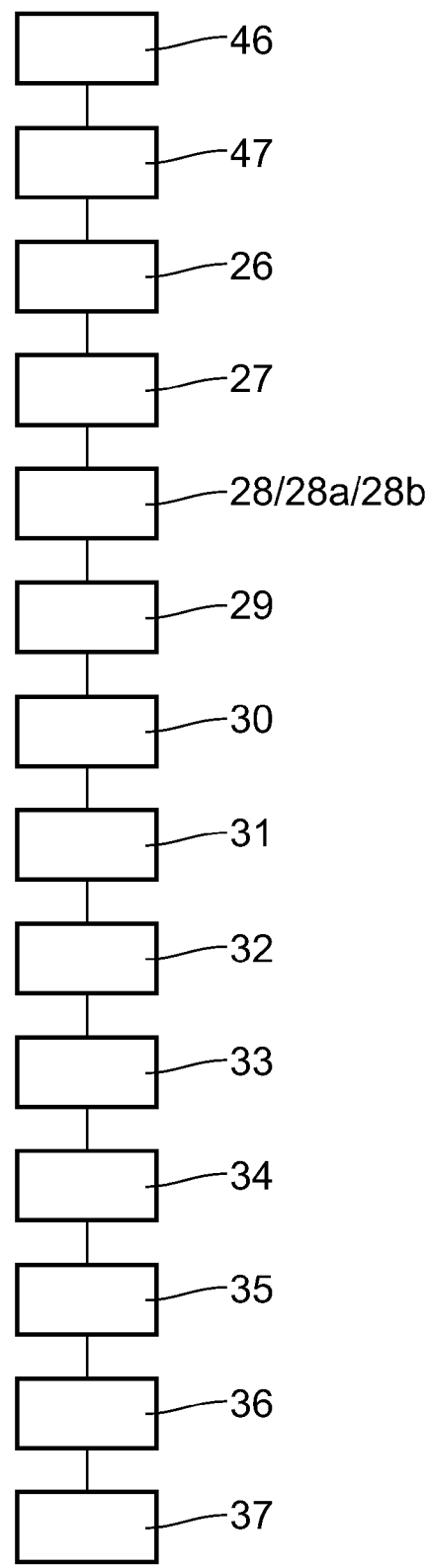
FIG. 6 shows a schematic flowchart of a method for assigning a pupil facet of a pupil facet mirror of an illumination optical unit of a projection exposure apparatus for EUV lithography to a field facet of a field facet mirror of the illumination optical unit for the definition of an illumination channel for a partial beam of illumination light.

With reference to FIG. 6, a description is given below of a method for assigning a respective pupil facet 11 of the pupil facet mirror 10 of the illumination optical unit 23 of the projection exposure apparatus 1 to a respective one of the field facets 7 of the field facet mirror 6 of the illumination optical unit 23 for the definition of a respective illumination channel for a partial beam of the illumination light 3. That partial beam of the illumination light 3 which is guided via the illumination channel, proceeding from the light source 2, is reflected at the assigned field facet 7 of the field facet mirror 6 and subsequently at the pupil facet 11 of the pupil facet mirror 10 assigned via the method, if appropriate also via the transfer optical unit 15, toward the object field 18.

In the context of the assignment method, firstly at least one illumination parameter with which an illumination of the object field 18 can be characterized is identified in an identifying step 26. By way of example, a uniformity, a telecentricity or an ellipticity of the illumination can be used as illumination parameter. Definitions of these illumination parameters of uniformity, telecentricity and ellipticity are found, for example, in WO 2009/132 756 A1 and in DE 10 2006 059 024 A1. Alternatively, a structure resolution achievable by the illumination during the imaging of the illuminated object field 18 into an image field can be used as illumination parameter. Instead of the telecentricity or the ellipticity, e.g. a variation of a line width of an imaged structure over the image field can be used as illumination parameter.

The imaged structure variable can be a critical dimension (CD). The object structure image variable is the magnitude of a distance value in the image plane of a typical reference structure which is imaged into the image field with the aid of the projection optical unit. One example thereof is the so-called "pitch", i.e. the distance between two adjacent lines in the image field. The structure image variable variation ($\Delta$CD) can be, if linear object structures are imaged, the variation of a line width in which an intensity of the imaging light is above a resist threshold intensity required for developing a light-sensitive layer on the substrate or wafer. The line width, that is to say the imaged structure variable, can vary independently of a distance between two adjacent lines, that is to say independently of a pitch of the object structure as an example of the further object structure variable, over a field height.

The identifying step 26 involves firstly interrogating the nature of the requirements made of an illumination of the object field 18 for the respective exposure task. Depending on the exposure task, a particularly homogeneous intensity distribution over the object field 18 may be desired. In this case, the uniformity is the illumination parameter identified in the identifying step 26. Alternatively, for example in order to make superimposition requirements manageable during multiple exposure of the wafer 22 via the projection exposure apparatus 1, a predefined telecentricity value may need to be set. In this case, the telecentricity is identified as illumination parameter in the identifying step 26. The same correspondingly applies to cases in which a specific weighting of illumination angle distributions over the object field 18 is desired. In this case, the ellipticity is selected as illumination parameter characterizing the illumination of the object field 18 in the identifying step 26. Alternatively or additionally, the line width that can be imaged and/or a depth of focus and/or a defocusing of the imaging of the field facets 7 into the object plane 16 can also be used as illumination parameters. A throughput of the projection exposure apparatus 1, that is to say the number of exposed wafers 22 that can be achieved in a specific period of time, can also be used.

A determining step 27, during the assignment method, involves determining a dependence of the indentified illumination parameter or, if appropriate, a combination of identified illumination parameters, which can be a weighted combination, on design predefinition data of the optical parameters of the light source 2 and/or of the illumination optical unit 23.

The design predefinition data can be specification data of the optical parameters of the light source 2 and/or of the illumination optical unit 23, that is to say intervals within which the corresponding variables must lie. Expected values for the optical parameters can also be involved. With regard to the light source, optical parameters are, for example, the size of a luminous spot or luminous volume of the light source, a distribution of an emission intensity over the luminous spot or the luminous volume, an emission direction characteristic of the light source, a used wavelength including a used wavelength distribution and a used light intensity emitted within a used aperture angle, a possibly present pulse frequency of the light source, a possibly present pulse duration of the light source, and indications concerning the temporal behavior of a useable light source intensity including a temporal behavior of the emission intensity itself and a temporal behavior of an emission direction stability.

Alternatively or additionally, during the assignment method, a further determining step 28 can involve determining a dependence of the identified illumination parameter on individual-part acceptance data of the optical parameters of the light source 2 and/or of the illumination optical unit 23. Individual-part acceptance data concerning the illumination optical unit 23 are the optical parameters of the components of the illumination optical unit 23, that is to say the arrangement of the components from which the illumination optical unit 23 is constructed, including the radii of curvature, the reflectivities, the distances between the components and the relative position of the field facets 7 with respect to one another and of the pupil facets 11 with respect to one another. In the case of the tiltable field facets 7, the position of centers of the respective facet reflection angles and a spatial characterization of the tilting positions that can be attained in each case by the facets 7 and 11 belong to the production data. Individual-part acceptance data can be determined as soon as a specific component has been produced. These data are therefore individual for the specific component, in contrast to design predefinition data, which are identical for every component of the same type.

The optical parameters of the illumination optical unit 23 can also include information concerning temporal drifts, that is to say for example information concerning the thermal dependence of a behavior of the illumination optical unit 23. The optical parameters of the illumination optical unit 23 also include reflectivity data of the respective mirror surfaces for given angles of incidence.

The optical parameters can also include data of the projection optical unit 19, that is to say information about the form of those surfaces of the components of the projection optical unit 19 which guide the illumination beam, in particular mirror reflection surface shapes, the distances between the components of the projection optical unit, and information about coatings possibly present on the components of the projection optical unit 19 in order to optimize the throughput thereof.

The design predefinition data are those data which are specified independently of the projection exposure apparatus actually produced. The individual-part acceptance data are data which relate to a specific component actually produced, and therefore also to the specific projection exposure apparatus in which the specific component is incorporated.

After the completion of the projection exposure apparatus or of a relatively large assembly, such as the illumination optical unit 23, for example, optical parameters of this individual assembly and/or projection exposure apparatus can likewise be determined, in which case total-system acceptance data determined at the production location are then involved.

An alternative and additional determining step 28a can therefore involve determining a dependence of the identified illumination parameter on the total-system acceptance data of the optical parameters at the location of the production of the light source 2 and/or of the illumination optical unit 23. Total-system acceptance data relate, in particular, to assemblies which are transported inherently completely, but separately from other assemblies, to the operating location.

After installation and adjustment of the projection exposure apparatus at the operating location, further determinations of optical parameters can be carried out. The latter are designated as calibration data. A further or alternative additional determining step 28b involves determining a dependence of the identified illumination parameter on the calibration data of the optical parameters of the light source 2 and/or of the illumination optical unit 23 at the location of the installation of the projection exposure apparatus 1.

During the operation of the projection exposure apparatus, optical parameters can be determined with the aid of at least one measuring device in or on the projection exposure apparatus, the optical parameters being designated here as online measurement data. A further alternative or additional determining step 29 involves determining a dependence of the identified illumination parameter on the online measurement data of the optical parameters of the light source 2 and/or of the illumination optical unit 23.

The later the value of an optical parameter is determined in the chain of determining operations described here, the better it corresponds to the value of the optical parameter during the operation of the projection exposure apparatus, and thus to the value of the optical parameter which is relevant for producing a microlithographic structure. However, certain optical parameters can be determined more easily at the start of the chain described here.

The determining step 27 involves predefining specific design predefinition data of the optical parameters of the light source 2, of the illumination optical unit 23 and/or of the projection optical unit 19, and checking the dependence of the illumination parameter identified in step 26 on the design predefinition data.

The further determining step 28 alternatively or additionally carried out involves checking a dependence of the respectively identified illumination parameter on the individual-part acceptance data of the optical parameters of the light source 2 and/or of the illumination optical unit 23. The determining step 28 presupposes an initial measurement of the components from which a light source 2 and/or an illumination optical unit 23 will be constructed. The individual-part acceptance data of the optical parameters are those values of the optical parameters of the concretely manufactured components of the projection exposure apparatus 1. They therefore involve those specifications of the concrete components of the light source 2 and of the concrete illumination optical unit 23 which deviate from the design predefinition data, that is to say the values of the optical parameters required by the optical design in relation to production, which generally specify ranges of values, by virtue of the fact that concrete individual-case data are now present. In so far as the design predefinition data are present as range indications, the individual-part acceptance data now represent concrete data within these ranges.

The further determining step 28a involves checking a dependence of the respectively identified illumination parameter on total-system acceptance data of the optical parameters of the light source 2 and/or of the illumination optical unit 23. The determining step 28a presupposes an initial measurement of the light source 2 and/or of the illumination optical unit 23 after assembly of the projection exposure apparatus 1 at the production location. The total-system acceptance of the optical parameters involves those values of the optical parameters of the concretely manufactured projection exposure apparatus 1. They therefore involve those specifications of the concrete light source 2 and of the concrete illumination optical unit 23 which deviate from the design predefinition data, that is to say the manufacturer-assured specifications, which generally specify ranges of values, by virtue of the fact that concrete individual-case data are now present. In so far as the design predefinition data are present as range indications, the total-system acceptance data now represent concrete data within these ranges.

The further determining step 28b involves checking a dependence of the respectively identified illumination parameter on the calibration data of the optical parameters of the light source 2 and/or of the illumination optical unit 23. The determining step 28b presupposes an initial measurement of the light source 2 and/or of the illumination optical unit 23 after assembly of the projection exposure apparatus 1 at the operating location. The calibration data of the optical parameters are those values of the optical parameters of the concretely manufactured projection exposure apparatus 1 which may deviate from those measured at the production location on account of transport and renewed adjustment. They therefore involve those specifications of the concrete light source 2 and of the concrete illumination optical unit 23 which deviate from the design predefinition data, that is to say the manufacturer-assured specifications, which generally specify ranges of values, by virtue of the fact that concrete individual-case data are now present. In so far as the design predefinition data are present as range indications, the calibration data now represent concrete data within these ranges.

The optical parameters include the reflectivities of the mirror surfaces of the illumination optical unit 23 which are present in a concrete projection exposure apparatus 1, that is to say for the angles of incidence given there. With regard to checking the dependence of the identified illumination parameter on the optical parameters, the determining steps 28, 28a and 28b correspond to the determining step 27.

The further determining step 29 involves checking a dependence of the identified illumination parameter on the online measurement data of the optical parameters of the light source 2, the illumination optical unit 23 and/or the projection optical unit 19. The online measurement data of the optical parameters are current measurement values which were measured on the projection exposure apparatus 1. The checking step 29 therefore presupposes a current measurement of the projection exposure apparatus 1. In this case, therefore, a current status of the projection exposure apparatus 1 is determined and, by way of example, the used light intensity of the light source 2 that is currently available is measured and the used light wavelength is also determined. In the case of the illumination optical unit 23, by way of example, a throughput of the illumination optical unit 23 is determined. Such a determination of throughput can comprise a reflectivity measurement of all involved reflective surfaces of the illumination optical unit 23. Correspondingly, online measurement data concerning the projection optical unit 19 can also be ascertained.

After the identifying step 26 and the performance of at least one of the determining steps 27, 28, 28a, 28b and 29, depending on the illumination parameter identified and depending on the result of the dependencies of the identified illumination parameter determined in steps 27, 28, 28a, 28b and 29, an illumination-channel-dependent evaluation function for evaluating a possible illumination channel is predefined in a predefining step 30. The result of the evaluation function predefined in step 30 therefore correlates with the illumination parameter identified in step 26 and the dependencies thereof on the design predefinition data of the optical parameters of the light source, the illumination optical unit and/or the projection optical unit, on the individual-part acceptance data of the optical parameters of the light source, the illumination optical unit and/or the projection optical unit, on the total-system acceptance data of the optical parameters of the light source, the illumination optical unit and/or the projection optical unit, on the calibration data of the optical parameters of the light source, the illumination optical unit and/or the projection optical unit, and on the online measurement data of the light source, the illumination optical unit and/or the projection optical unit. The evaluation function therefore allows the evaluation of a possible combination of one of the field facets 7 with one of the pupil facets 11 for guiding a partial beam of the illumination light 3 via the illumination channel thereby defined.

The following characteristics of the illumination channel respectively to be evaluated can be incorporated into the evaluation function predefined in the predefining step 30:

a possibly inhomogeneous illumination of the field facets 7 with the illumination light 3; a deviation of an intensity of an illumination of the field facets 7 with the illumination light 3 from a homogeneous illumination intensity for the illumination channel respectively considered can then be incorporated into the evaluation function;

a shading of the field facets 7 among one another, for example a shading of part of one of the field facets 7 by a neighboring field facet, particularly when the two neighboring field facets 7 are tilted into greatly different tilting positions (also cf. the description below in connection with FIGS. 7 and 8);

a reflectivity of the facets 7, 11 for the illumination light 3, the reflectivity being dependent on the angle of incidence of the illumination light 3 on the facets 7, 11 of the illumination channel to be evaluated; an angle of incidence of the respective partial beam of the illumination light 3 on the facets 7, 11 of the illumination channel considered can therefore be incorporated into the evaluation function;

a reflectivity of the transfer optical unit 15 situated downstream of the facet mirrors 6, 10, the reflectivity being dependent on the illumination channel to be evaluated;

a spot image of the field facets or a local geometric pupil aberration, wherein the term spot image denotes the form and intensity distribution of the partial beam guided along exactly one illumination channel exactly on the pupil facet, which will be explained further below;

an illumination-channel-dependent imaging scale, that is to say the ratio of the dimensions firstly of the field facet 7 of the illumination channel to be evaluated and secondly of the image of the field facet 7 in the object plane 16, firstly parallel to the x-direction and secondly parallel to the y-direction;

a parameterization of an illumination-channel-dependent distortion of the imaging of the field facets 7 into the object plane 16, for example as a result of grazing incidence on the mirror 14 and effects which result on account of deviations between a position of the pupil facet mirror 10 and an entrance pupil or an image of an entrance pupil of the projection optical unit 19;

an illumination-channel-dependent variation of a structure image variable, that is to say for example a variation of an imaged line width. This line width variation can be assessed differently for different profiles of the lines to be imaged. By way of example, it is possible to register the size of the difference between the imaged line width of horizontally and vertically running structure lines which are at the same distance from one another on the object side. Alternatively or additionally, the structure variable variation, that is to say for example line width variation, of diagonally running object lines to be imaged can be considered as the evaluation function or as part thereof;

an illumination-channel-dependent effect of the light source 2, for example an illumination-channel-dependent inhomogeneity of an emission of the light source 2, caused for example by a variable shading, by an imperfect imaging of the field facets 7 into the object field 18, or by a variable emission centroid of the light source 2, depending on the emission direction thereof;

a focus stability of the projection lens 19, that is to say information about whether and how a position of the field plane 21 changes relative to the position of the object plane 16 and/or what influence a position variation of the reticle 17 with respect to the object plane 16 has on an image position in the image plane 21;

information concerning a height profile of a layer structure on the wafer 22, in particular information concerning a height profile of layers already exposed in an earlier exposure step on the wafer 22. These data can be part of the calibration data. Indications regarding a required depth of focus of the projection optical unit 19 can be derived from these height profile data in the context of the predefining step 30 and also in the context of a downstream predefining step, which will be explained below;

information concerning a resist coating on the wafer 22, in particular information concerning the required exposure dose for resist development and information concerning the development response behavior of the resist. It is possible to derive therefrom, e.g. in the predefining step 30, indications about an exposure dose to be complied with for the wafer 22, that is to say information about what dose of the illumination light 3 is intended to impinge on a region to be exposed of the wafer 22.

These characteristics emerge as dependencies of the respective illumination parameter on design predefinition data of the optical parameters of the light source 2, the illumination optical unit 23 and/or the projection optical unit 19; moreover, the respective illumination parameter can be dependent on individual-part acceptance data of the optical parameters of the light source 2, the illumination optical unit 23 and/or the projection optical unit 19, dependent on the total-system acceptance data, dependent on the calibration data and dependent on the online measurement data of the optical parameters of the light source 2, the illumination optical unit 23 and/or the projection optical unit 19.

An imperfect imaging of the field facets 7 into the object field 18, besides imaging aberrations introduced via the imaging optical unit, can also stem from the fact that the light source 2 is not a point light source. Ultimately, therefore, this always results in an image of the field facets 7 that is blurred at the edges in the object plane 16. The quality of this imaging is dependent on the assignment of the field facets 7 and of the pupil facets 11 to the respective illumination channel. Specific assignments lead to a qualitatively better imaging than others. Moreover, in the case of a light source that is not a point light source or spherical light source, different field facets among the field facets 7 see the light source 2 in a different shape.

Aberration contributions as a result of distortion effects of a transfer optical unit between the field facet mirror and the object plane which are parameterizable via the evaluation function are discussed by way of example in WO 2010/037 453 A1. Pupil effects which can likewise be illumination-channel-dependent and which can be incorporated into the evaluation function are explained for example in DE 10 2006 059 024 A.

The evaluation function can comprise a plurality of the illumination parameters which, weighted differently with respect to one another, can be incorporated into the evaluation function.

In the context of the assignment method, an evaluation target range of evaluation variables which represent the result of the evaluation function is predefined in a further predefining step 31. Therefore, the pairing (field facet, pupil facet) associated with an illumination channel to be evaluated is incorporated into the evaluation function and depending on this the evaluation variable is determined via the evaluation function. The predefining step 31 involves specifying a target range of the evaluation variable which has to be attained in order that a configuration of illumination channels that is to be evaluated is included in a further selection.

In the context of the assignment method, in an optional calculating step 32, the evaluation variable is then calculated for at least selected illumination channels from the possible illumination channels by insertion into the evaluation function.

In a likewise optional preselecting step 33, those illumination channels, that is to say those pairings of field facets 7 to pupil facets 11, are preselected whose evaluation variable calculated in step 32 attains the evaluation target range predefined in the predefining step 31.

An optional identifying step 34 of the assignment method involves identifying at least one disturbance variable which influences an illumination of the object field 18 by the illumination optical unit 23 or by an illumination system comprising the illumination optical unit 23 and the light source 2.

By way of example, a variation of a positioning of the light source 2 in the x-, y- or z-direction can be selected as disturbance variable. A variation of a source variable of the light source 2 can also be used as disturbance variable. A change in a type of the light source 2, for example between an LPP source and a GDPP source, can also be used as disturbance variable. Furthermore, a simulated lifetime effect, for example with regard to an age of reflective layers of the components guiding the illumination light 3, can be used as disturbance variable. An increase in stray light as a result of a simulated aging of the illumination optical unit 23 can also be used as disturbance variable. Furthermore, application of illumination light 3 that is not used for illumination to the pupil facet 11 of the illumination channel to be evaluated, and thus an additional heating of the pupil facet 11, can be used as disturbance variable.

After the disturbance variable identifying step 34, a dependence of the evaluation function on the at least one disturbance variable identified is identified in a further optional identifying step 35.

An optional variation step 36 then involves varying the disturbance variable identified for the preselected illumination channels within a predefined disturbance variable variation range, and calculating the variation of the evaluation variable that follows therefrom via the evaluation function and the dependence identified in the identifying step 35.

A selection step 37 concluding the assignment method involves selecting those illumination channels whose varied evaluation variable remains within the evaluation target range in the entire disturbance variable variation range.

The assignment method comprising steps 26 to 37 is repeated until a predefined number of field facets 7 of the field facet mirror 6 are assigned a respectively still free pupil facet 11 of the pupil facet mirror 10. The result of the assignment method can also be a plurality of assignments of the field facets 7 to in each case other pupil facets 11, provided that all these assignments satisfy the evaluation criteria within steps 27 to 34 of the assignment method.

A variant of the assignment method ensures that the assignment of the pupil facets 11 to the pupil facet sets to which an illumination light partial beam can be applied in particular in a manner dependent on tilting position by in each case exactly one field facet 7, that is to say which are assigned in each case to this exactly one field facet 7, is such that illumination light can be simultaneously applied to desired groups of pupil facets. This will also be discussed later.

In a variant of the assignment method, after the conclusion of the assignment method it is known which of the pupil facets 11 are assigned to which of the field facets 7 via the different tilting positions of the field facets 7. The pupil facets 11 of the pupil facet mirror 10 are therefore assigned in each case to a pupil facet set which is assigned in each case to exactly one field facet 7 of the field facet mirror 6. Tilting positions of the pupil facets 11 can then be fixedly predefined such that, for the case of application to the respective pupil facet 11, the latter reflects the illumination light 3 toward the object field 18. After the assignment method has been carried out, this pupil facet tilting angle predefinition can be fixedly performed since the tilting angle of the respective pupil facets 11 no longer changes after the assignment of the pupil facets 11 to the pupil facet sets has been carried out.

In one variant of the assignment method, besides the desired values of the design predefinition data, the actual values of the design predefinition data and the calibration data, if appropriate user predefinitions are also incorporated as input data.

The assignment method outputs as output data the tilting angles to be driven for the pupil facets 11. These tilting angles are then predefined either manually or by an actuator system in the case of the pupil facet mirror 10. For this purpose, the individual pupil facets 11 can be tiltable via individually drivable actuators. A realization of the pupil facet mirror 10 as an MEMS mirror array comprising micro mirrors that are tiltable individually by an actuator system corresponds to such individually drivable actuators in terms of its effect.

The illumination setting to be predefined via the illumination optical unit 23, that is to say the illumination angle distribution for the reticle 17 in the object field 18, can also be incorporated into the assignment method. In this case, on the basis of the result of the selecting step 37, the tilting illumination positions of the field facets 7 are then adjusted and the pupil facets 11 assigned via the selected illumination channels are correspondingly adjusted. In this variant of the assignment method in which an illumination setting is also set, the design predefinition data, the individual-part acceptance data, the total-system acceptance data, the calibration data and/or the online measurement data of optical parameters and user data, namely the illumination setting to be selected, are incorporated as input data into the assignment method. Output data of the assignment method are the tilting angles of the pupil field facets 11 and the tilting position to be set in each case for the field facets 7.

Optionally, the output data of the assignment method can also include a data set which characterizes an actual illumination setting that has been set. The latter can then be compared with the user's desire, that is to say the desired illumination setting to be predefined.

Alternatively or additionally, after the conclusion of the assignment method, a data set can also be output which, on the basis of the result of the selecting step 37, characterizes the illumination settings which can be set via the different tilting positions of the field facets 7.

The characterization of the illumination settings can contain indications concerning the expected intensity which reaches each object field point from each illumination direction.

The selection of the illumination channels via the assignment method can make use of a "simulated annealing" algorithm. In this case, this begins with a specific illumination channel and varies the disturbance variable in the variation step 36 and calculates the variation of the evaluation variable that follows therefrom. Afterwards, a further illumination channel, which differs only slightly from the initially used illumination channel with regard to the guidance of the partial beam of the illumination light 3, can be selected for evaluation, for example by two field facets 7 interchanging the pupil facets 11 assigned to them. The variation step 36 is then carried out again for all of the illumination channels which then arise. The change made, that is to say the exchange of the pupil facets which are assigned to two specific field facets from the field facets 7, is accepted, provided that the evaluation criteria of the assignment method are satisfied. On the basis of such change steps, the evaluation variable is optimized whilst taking account of the disturbance variable variation by the variation step 36 being successively applied. The assignment of the individual field facets 7 to the individual pupil facets 11 via corresponding illumination channels at the beginning of carrying out the assignment method is also designated hereinafter as start assignment or else as initial assignment.

Upon the selection of a start assignment of all illumination channels at the beginning of the assignment method or after a predefinition of a change step, symmetry considerations can have an influence. By way of example, the start assignment can take account of pairs of field facets 7 with a mutually complementary intensity profile of a field facet impingement by the light source 2. Such pairs of the field facets 7 can impinge on neighboring pupil facets from the pupil facets 11. The complementary field profiles then compensate for one another when the field facet images are superimposed in the object field 18, such that it is possible to minimize a field dependence over the object field 18. Changes in the assignments of the illumination channels in the context of the search for an optimum of the evaluation variable are then carried out only in such a way that a corresponding pairing of facets with complementary field profiles is maintained. The disturbance variable variation ensures that the desired complementarity is maintained even in the case of changes of, for example, the light source 2.

A start assignment of the illumination channels which is optimized via the assignment method can also proceed from a point-symmetrical arrangement of illumination channels, in which, therefore, assigned illumination channels merge into one another by rotation by a predefined angle ϕ about a center of carrier plates of the field facet mirror 6, on the one hand, and of the pupil facet mirror 10, on the other hand. In this case, too, a change in the assignment is carried out in such a way that the symmetry is maintained. The point symmetry therefore constitutes a parameter which is incorporated into the evaluation function.

The start assignment can have, for example, positions—rotated by 90° in polar coordinates—of field facets which have the same intensity profile of an impingement by the light source 2 and whose assigned pupil facets 11 are arranged in the pupil in a manner rotated by 90° in polar coordinates relative to one another. In each case two of such field facets can be present in the start assignment, the assigned pupil facets of which are arranged in the pupil in a manner rotated by 90° in polar coordinates relative to one another. Another assignment strategy which can be used as start assignment and in which the field facets having the same intensity profile are assigned four pupil facets, which are arranged in a manner rotated by 90° in polar coordinates relative to one another, is described in DE 10 2006 036 064 A1.

A start assignment can take account of the mirror symmetry of the illumination optical unit 23 according to FIG. 1 with respect to the plane of the drawing therein, that is to say the meridional plane. In alternative designs of the illumination optical unit 23 which are at least approximately also mirror-symmetrical with respect to further planes, for example in a design of the illumination optical unit in accordance with DE 103 29 141 A1, this corresponding further mirror symmetry can also be taken into account when predefining an initial channel assignment.

Further examples of pairwise assignments which can be chosen for an initial assignment of the illumination channels before the beginning of the assignment method are described, for example, in WO 2009/132 756 A1.

Alternatively, an assignment of the field facets 7 to pupil facets 11 at the beginning of the assignment method can be configured such that neighboring field facets from the field facets 7 illuminate non-neighboring pupil facets 11, that is to say pupil facets 11 separated from one another by a predefined number of further pupil facets 11. Such a start assignment minimizes stray light that can arise when illumination channels have an overall closely neighboring profile, such that illumination light guided along one illumination channel scatters undesirably into the other illumination channel. The stray light criterion, too, can therefore be a criterion which is incorporated into the evaluation function.

Further criteria in association with selecting a suitable initial assignment of the illumination channels or with predefining a strategy upon changing the channel assignment in the context of, for example, a simulated annealing optimization method are a minimization of the angles of incidence on the individual facets 7, 11 or a minimization of a switching travel for the case of the use of facets 7, 11 which can be displaced between at least two illumination tilting positions.

The field facets 7 which neighbor the edge of the zone on which the field facets 7 are arranged, for example the edge of the carrier plate 24, can be especially taken into account when predefining an initial assignment of the illumination channels at the beginning of the assignment method. For these marginal field facets 7, the selection of the assigned pupil facets 11 permissible in the start assignment can be restricted, for example, by the predefinition of a list of allowed pupil facets from the pupil facets 11. This selection can be effected such that an imaging of the marginal field facets 7 by the pupil facets 11 and the downstream transfer optical unit 15 does not experience undesirable imaging aberrations, in particular does not experience undesirable rotation or displacement.

In so far as desired values for illumination settings to be predefined are incorporated into the assignment method, in a final optimization step for the illumination channel assignment a post-processing can be effected by the at least one desired illumination setting being compared with actual illumination settings which arise in the case of the illumination channel assignment found. During the post-processing, the illumination channel assignment found is varied again with the aim of further reducing desired/actual deviations possibly present in the illumination settings.

To prepare for the predefining step 30 for the evaluation function, it is possible to predefine a position of the pupil facets 11. This is done in the cases in which the pupil facet mirror 10 is designed in such a way that the pupil facets 11 are variable in terms of their position and/or in terms of their size and/or in terms of their number. This is the case for example if the pupil facets 11 are formed as individual-mirror groups of an MEMS mirror array.

In so far as it is possible to predefine a position and/or size and/or number of the pupil facets, this can be performed in a manner taking account of a size of a luminous volume of the light source 2, in particular at the location of the intermediate focal plane 5. A required minimum size of the pupil facets 11 can be derived from this size of the luminous volume or of the light spot of the light source 2.

Within the assignment method it is possible to check the extent to which the size of a light spot image, that is to say of a secondary light source, on the respectively predefined pupil facets 11 is dependent on the concrete assignment of the illumination channels. This is generally the case if, for example on account of different light paths of the illumination light partial beams via the illumination channels, different imaging qualities arise during the transfer of the intermediate focal plane 5 into the arrangement plane of the pupil facet mirror 10.

Depending on a found minimum size of the pupil facets, an arrangement of the pupil facets 11 on a carrier plate of the pupil facet mirror 10 or an assignment of the individual mirrors of a pupil facet MEMS mirror array can then be performed.

In so far as, in the case of a configuration of the pupil facet mirror 10 as an MEMS mirror array, a size of the pupil facets formed as individual-mirror groups arises which leads to a number of the pupil facet individual-mirror groups or to a number of the pupil facet sets drivable via different field facets 7 which is greater than the number of field facets, two pupil facet individual-mirror groups can be assigned to predefined field facets in order to increase the effective number of field facets, wherein the respective field facets 7, which can then likewise be embodied as individual-mirror groups of an MEMS mirror array, distribute the illumination light 3 between two different pupil facet individual-mirror groups. The illumination light can then be applied to two pupil facets via exactly one of the field facets.

In so far as the assignment of the individual-mirror groups of the pupil facet mirror 10 to pupil facets 11 has the consequence that the number of resulting pupil facet individual-mirror groups or the number of pupil facet sets is less than the number of field facets 7, this is taken into account in the illumination channel assignment by e.g. disregarding field facets 7 which are only weakly illuminated by the light source 2.

The illumination channel assignment can take account of user predefinitions concerning illumination settings which are intended to be set by the projection exposure apparatus 1. If corresponding user predefinitions are not present, standard illumination settings are used. Such standard illumination settings may be:

annular (ring-shaped) illumination setting with small illumination angles;

annular illumination setting with medium illumination angles;

annular illumination setting with large illumination angles;

x-dipole setting;

y-dipole setting;

dipole setting with predefined dipole rotation angle about a pupil center, for example 45°;

quadrupole setting;

hexapole setting.

Corresponding standard illumination settings are known from the prior art, for example from DE 10 2008 021 833 A1.

Alternatively or additionally, it is possible to use individual illumination settings in accordance with user predefinitions. Between the standard illumination settings and/or the user-dependent, that is to say customer-specific, illumination settings it is possible to implement a prioritization, for example by the use of weighting factors.

During the selecting step 37, in the context of a start assignment of the illumination channels, this then involves firstly predefining the respective illumination settings, that is to say predefining arrangements or groups of the pupil facets 11 on the pupil facet mirror 10 onto which the illumination light 3 can be deflected proceeding from different field facets 7. In this case, the pupil facets 11 are arranged in accordance with the set of illumination settings that is to be respectively predefined. Afterward, during the selection of the start assignment, an assignment of the field facets 7 to the pupil facets 11 with corresponding predefinition of arrangements of sets of the pupil facets 11 is carried out in such a way that exclusively pupil facets 11 of different pupil facet sets (pupil facets which are assigned to different tilting positions of the same field facet) are arranged in each pupil facet group (pupil facets which are assigned to different field facets for predefining a specific illumination setting).

The field facets 7 can also be predefined with regard to their position and/or with regard to their size and/or with regard to their number, in the manner as already explained above with reference to the pupil facets 11. This is possible in the context of the start selection particularly if the field facet mirror 6 is embodied as an MEMS mirror array.

A required size of the respective field facet 7 may be dependent on the illumination channel since a magnification scale of an imaging of the field facet 7 into the object field 18 is dependent on the exact guidance of the illumination channel in the illumination optical unit 23. This can be taken into account by way of a post-processing during an optimization of the selecting step 37.

In this case, the field facets 7 of the selected illumination channel assignments can also be laterally displaced and/or adapted in terms of their size.

A radius of curvature of the field facets 7 can also be adapted, as described in US 2011/0001947 A1.

In order to determine a size predefinition for the respective field facet 7, it is possible to carry out a back-projection of the object field 18 via the respectively assigned pupil facet 11 into an arrangement plane of the field facet mirror 6 into the region of the field facet 7 to be determined in terms of sizes. A standard size of the field facets 7 can be chosen to be somewhat larger, e.g. a few percent larger, than the size of the field facets 7 which arises on the basis of such a back-projection. This takes account of an effective reduction of a facet projection during the tilting of the field facets and also takes account of shading effects that possibly arise between neighboring field facets 7. It may be advantageous to choose the size of the field facets 7 along the object displacement direction y to be somewhat smaller than according to the back-projection, while transversely with respect to an object displacement direction y, that is to say in the x-direction, the size of the field facets 7 is chosen to be somewhat larger than according to the back-projection.

If, after determining the size of the field facets 7, it emerges that the number of field facets 7 of the determined size on the field facet mirror 6 is less than the number of pupil facets 11 available on the pupil facet mirror 10, in the case of a configuration of the field facet mirror 6 as an MEMS mirror array it is possible to use mutually overlapping field facet mirrors 7, wherein one and the same individual mirror of the MEMS mirror array is then assigned e.g. to two individual-mirror groups that construct in each case one of the field facets. Alternatively, the MEMS field facets 7 can be reduced in terms of their y-dimension, such that they no longer illuminate a complete y-dimension of the object field 18.

The evaluation function to be predefined in the predefining step 30 can contain the weighted sum of an illumination intensity of the pupil facets 11 within at least one pupil facet environment. In this case, during an illumination channel assignment that is currently to be evaluated, consideration is given to the intensity of the illumination light 3 with which those pupil facets 11 are illuminated which neighbor a respectively considered pupil facet 11 within a predefined environment. A plurality of predefined environment variables can be incorporated into the evaluation function. The illumination intensities of the pupil facets present within the environment can in turn be weighted depending on the neighborhood ratio.

The start selection can take account of the fact that only specific illumination settings are actually used during the projection exposure. These selected illumination settings are then incorporated into the evaluation function.

A suitable design of the arrangement of the field facets 7 on the field facet mirror 6 makes it possible to change, and in particular reduce, the influence of specific disturbance variables from among the disturbance variables on the evaluation function. This is explained in greater detail below with reference to FIGS. 7 and 8 for the disturbance variable "shading of neighboring field facets 7".

FIG. 7 shows two neighboring field facets 7 in perspective view, which are designated hereinafter by $7_1$ and $7_2$. The two field facets $7_1$, $7_2$ are tilted relative to one another about a tilting axis 38 parallel to the y-axis and, as a result, assume corresponding illumination tilting positions for assigning predefined pupil facets from the pupil facets 11 via corresponding illumination channels. In the case of the arrangement of the two field facets $7_1$, $7_2$ according to FIG. 7, these directly adjoin one another over their respective long sides of the reflective facet surfaces. On account of the different tilting of the two field facets $7_1$, $7_2$ about the tilting axis 38, a triangular shading region 39 arises, assuming correspondingly oblique incidence of the illumination light 3, on the reflection surface of the field facet $7_2$, the shading region having a largest extent along the y-axis in the region of one of the short sides of the reflection surface of the field facet $7_2$, the largest extent being designated by d in FIG. 7.

FIG. 8 shows the two field facets $7_1$, $7_2$ in a tilting arrangement about the tilting axis 38 that corresponds to FIG. 7, this tilting arrangement differing from the arrangement according to FIG. 7 merely in that the reflection surfaces of the two field facets $7_1$, $7_2$ are at a distance of d from one another along the y-axis. Assuming the same angle of incidence of the illumination light 3 as in FIG. 7, the field facet $7_1$ therefore does not shade the facet $7_2$ in the case of the arrangement according to FIG. 8.

When calculating the evaluation function in the variation step 36, assuming a correspondingly spaced-apart arrangement of specific pairs of the field facets 7, it is possible to take account of the fact that specific field facets from the field facets 7, on account of a distance present with respect to the neighboring field facets, bring about precisely no shading with respect to neighboring field facets from the field facets 7 even in the case of comparatively large relative differences in the field facet tilting angles.

The following shading scan integral can be incorporated into the evaluation function during the disturbance variable variation in step 36:

$$I_i(x/x_P, y_P, \alpha, \beta) = I_0(x/x_F^{(i)}, y_F^{(i)}, x_P, y_P)[1 - a_{i,upper\ neighbor}(\alpha_x, \alpha_y, \beta_x, \beta_y) - a_{i,lower\ neighbor}(\alpha_x, \alpha_y, \beta_x, \beta_y)]$$

In this case:
I(x) denotes scan-integrated illumination light intensity at a location x of the reticle 17;
$I_i$ denotes scan-integrated intensity of the illumination channel which is guided via the field facet i;
$x_p$, $y_p$ denote coordinates of the pupil facet of the respective illumination channel;
α, β denote tilting angles of the field facet respectively considered and of the neighboring facets;
$x^{(i)}_F$, $y^{(i)}_F$ denote coordinates of the field facet i considered;
$a_{i,j}$ denotes shading function (i denotes facet respectively considered, j denotes neighboring facet);
$\alpha_x$, $\alpha_y$ denote tilting angles of the field facet i considered;
$\beta_x$, $\beta_y$ denote tilting angles of the neighboring facet.

When selecting an initial assignment of the illumination channels, it is possible, in particular, to take account of avoiding as far as possible large differences in the tilting of neighboring field facets 7 about tilting axes parallel to the y-axis. This is elucidated below with reference to FIG. 9. The latter shows highly schematically a further embodiment of the field facet mirror 6 and of the pupil facet mirror 10. Two of the field facets 7, namely the field facets $7_1$, $7_2$, and two of the pupil facets 11, namely the pupil facets $11_1$ and $11_2$, are highlighted by corresponding hatchings of the same type. The tilting adjustment of the two field facets $7_1$, $7_2$ is such that the field facet $7_1$ is assigned to the pupil facet $11_1$ and that the field facet $7_2$ is assigned to the pupil facet $11_2$ via a respective illumination channel. Since the two pupil facets $11_1$, $11_2$ have approximately the same x-coordinate, in order to achieve this assignment of the two illumination channels $(7_1, 11_1)$ and $(7_2, 11_2)$ the two field facets $7_1$, $7_2$ are tilted about their respective tilting axis 35 parallel to the y-axis to a good approximation by the same tilting angle. An appreciable shading between the two neighboring field facets $7_1$, $7_2$, which would be present in the case of a relatively great difference in the tilting about the tilting axis 35 (cf. FIG. 7), therefore does not take place in the case of the initial assignment according to FIG. 9.

In order to reduce the influence of aberrations of an imaging of the field facets 7 into the object plane 16, it is possible to optimize an arrangement of the pupil facet mirror 10 in a plane which corresponds to the entrance pupil of the projection optical unit 19, that is to say coincides with or is conjugate with respect to the latter. This is explained in greater detail below with reference to FIG. 10. The latter shows a variant of an illumination optical unit 40 which can be used instead of the illumination optical unit 23 in the projection exposure apparatus 1. Components of the illumination optical unit 40 which correspond to those which have already been explained above with reference to the illumination optical unit 23 bear the same reference signs and will not be discussed in detail again.

The illumination optical unit 40 has a collector 4 embodied as an ellipsoidal mirror. A transfer optical unit 41 in the beam path of the illumination light 3 downstream of the pupil facet mirror 10 has in the case of the illumination optical unit 40 as sole mirror a grazing incidence mirror comparable with the mirror 14 of the illumination optical unit 23.

The projection optical unit 19 is illustrated in greater detail in the case of the projection exposure apparatus 1 according to FIG. 10 and has six EUV mirrors M1, M2, M3, M4, M5 and M6 in the order of the imaging beam path between the object field 18 and the image field 20.

In the case of the illumination optical unit 40, the pupil facet mirror 10 lies in a pupil plane 42, which arises from an entrance pupil plane 43 of the projection optical unit 19 as a result of mirroring. The pupil facet mirror 10 is arranged exactly in the pupil plane 42 arising as a result of the mirroring. In this case, mirroring is effected at the object plane 16, wherein the folding is taken into account by the grazing incidence mirror of the transfer optical unit 41.

If the plane approximation for the entrance pupil of the projection optical unit 19 is abandoned, a spherical surface arises for the form of the entrance pupil, the spherical surface being designated by 44 in FIG. 10. The mirror image of the spherical entrance pupil 44 is indicated at 45 in FIG. 10.

A variant of the pupil facet mirror 10 can be curved concavely such that a carrier plate of the pupil facet mirror 10 with the pupil facets 11 arranged thereon exactly follows the curvature of the spherical pupil surface 45. Distortions of specific locations on the pupil facet mirror, the distortions being dependent on the position on the object field 18, which would have the effect of one and the same pupil facet 11 appearing at a different illumination angle at one specific location of the object field 18 relative to another location of the object field 18, can then be avoided. This makes it easier to comply with predefined values in particular for the illumination parameters of telecentricity and ellipticity. A correspondingly curved facet mirror is known on the basis of the example of a field facet mirror from DE 10 2008 042 876 A.

Channel-dependent reflectivities of the optical components which lie between the pupil facet 11 of the illumination channel considered and the object field 18 can be incorporated into the evaluation function. These are the mirrors 12 to 14 in the case of the illumination optical unit 23. This is the mirror of the transfer optical unit 41 in the case of the illumination optical unit 40.

The shape of a source image on the pupil facet 11 of the illumination channel considered can be incorporated into the evaluation function. An imaging scale of an imaging of the field facet of the illumination channel considered into the object field 18 can be incorporated into the evaluation function.

A variable describing an imaging of the field facet 7 of the illumination channel considered into the object field 18 can be incorporated into the evaluation function. This includes, in particular, an imaging aberration, for example a distortion, an image tilting, an image shading, a deviation of a field facet image from the object plane 16, a deviation (defocusing) of the pupil facet 11 of the illumination channel considered from an entrance pupil of the projection optical unit 19 or a plane corresponding to the entrance pupil, in particular a conjugate plane, or a depth of focus of the imaging.

A symmetry variable, a stray light variable, a line width to be imaged of an object arranged in the object field 18, or a position of the field facet 7 of the illumination channel considered within a far field of the light source 2 at the location of the field facet mirror 6 can be incorporated into the evaluation function.

The spot image of the field facets was indicated above as a characteristic on which the evaluation function to be predefined in the assignment method may be dependent. This characteristic is explained in greater detail below with reference to FIGS. 11 to 14.

FIG. 11 shows, in a highly schematic view corresponding to the side view according to FIG. 1 in terms of the viewing direction, the beam path of an EUV partial beam 48 of the EUV illumination light 3 between the intermediate focus lying in the intermediate focal plane 5 and the object field 18. The course of three EUV illumination light rays 49, 50, 51 is illustrated. The light rays 49 and 51 constitute marginal rays of the EUV partial beam 48. The light ray 50 constitutes a central or chief ray of the EUV partial beam 48. The course of the EUV partial beam 48 is represented in FIG. 11 without the further EUV mirrors 12 to 14 upstream of the object field 18. Moreover, neither the size relationships nor the distance relationships with respect to the single field facet 7 illustrated, the single pupil facet 11 illustrated and the object field 18 are true to scale. Along the beam path of the EUV partial beam 48, the intermediate focus is imaged into an intermediate focus image 52 after the reflection at the field facet 7 and before the reflection at the pupil facet 11. Since the intermediate focus image 52 lies in the beam path of the EUV partial beam 48 before the reflection at the pupil facet 11, the light rays 49 to 51 impinge at different locations 53, 54, 55 on the pupil facet 11, which are also designated as spots. After reflection at the spots 53 to 55, the light rays 49 to 51 impinge at different locations 56, 57, 58 on the object field 18, namely the light rays 49 and 51 marginally and the light ray 50 centrally.

FIG. 12 shows the pupil facet 11, as seen from the location 56 of the object field 18. The spot 53, as seen from the location 56, is offset toward the left, that is to say in the negative x-direction, relative to a center of the pupil facet 11.

FIG. 13 shows the pupil facet 11, as seen from the central location 57 of the object field 18. There the spot 54, that is to say the location where the light ray 50 impinges on the pupil facet 11, is situated centrally.

FIG. 14 shows the pupil facet 11, as seen from the marginal location 58 of the object field 18. There the spot 55 is offset toward the right, that is to say in the positive x-direction, relative to the center of the pupil facet 11.

On account of the fact that the imaging of the light source 2 or of the intermediate focus 5 onto the pupil facet 11 is not perfect, a slightly deviating illumination direction, proceeding from the pupil facet 11 respectively considered, therefore results depending on the location considered on the object field 18.

Besides the cause—made clear with reference to FIGS. 11 to 14—of an imaging of the intermediate focus in the beam path of the EUV partial beam 48 before the reflection at the pupil facet 11, there can also be other causes in respect of the fact that the spots on the pupil facets lie differently on the pupil facets 11 as viewed from different points on the object field 18. The respective spot image on the object field 18 can be determined accurately by geometrical analysis of the optical design of the illumination optical unit 23. Each assignment of a specific field facet 7 to a specific pupil facet 11 leads to a different spot image variation, such that the spot image is suitable as a characteristic for the evaluation function predefined in the predefining step 27 of the assignment method.

As a result of the assignment method, an assignment of the field facets to the pupil facets can result in which an inhomogeneous illumination of the field facets 7 is used for the compensation of the displacement of the spot image, as described above with reference to FIGS. 11 to 14. The geometrical displacement of an illumination angle distribution which arises as a result of superposition of the spot images on all the pupil facets can be compensated for by a corresponding adaptation of the intensities of the individual EUV partial beams 48 which are guided via the illumination channels. This is comparable with telecentricity compensation, since a product of the direction of the individual partial rays and the intensity thereof or a product of distance and intensity is also incorporated into the telecentricity value.

During the assignment it is possible to calculate a data set which assigns the following data to each field point of the object field 18 and thus also of the image field 20:
  distribution of the illumination angles which illuminate the field point,
  illumination intensities at the individual illumination angles.

Before the assignment method described above, the object structure, that is to say the structure of the reticle 17 to be imaged, can also be characterized. This characterization can be incorporated into the evaluation function. This object structure characterizing step is indicated as step 46 before the identifying step 26 in FIG. 6.

The characterization of the object structure can additionally be incorporated into the selection of at least one illumination setting to be predefined. This in turn influences, as already explained above, the performance of the assignment method. This illumination setting selecting step is indicated as step 47 in FIG. 6.

The tilting angles of the field facets 7 and of the pupil facets 11 can be predefined by corresponding driving of tilting angle actuators via a central control device of the illumination optical unit 23 or 40.

The assignment method takes place on an assignment computer.

The central control device is signal-connected to the assignment computer.

The invention claimed is:
1. A method of assigning a pupil facet of a pupil facet mirror of an illumination optical unit of a projection exposure apparatus to a field facet of a field facet mirror of the illumination optical unit to define an illumination channel for a partial beam of illumination light, which proceeding from a light source that generates the illumination light, reflects from the field facet and the assigned pupil facet then toward an object field, the method comprising:
- identifying an illumination parameter useable to evaluate an illumination of the object field;
- determining a dependence of the illumination parameter on at least one parameter selected from the group consisting of design predefinition data of optical parameters of the light source, design predefinition data of optical parameters of the illumination optical unit, individual part acceptance data of optical parameters of the light source, individual part acceptance data of optical parameters of the illumination optical unit, total system acceptance data of optical parameters of the light source at a location at which the light source is produced, total system acceptance data of optical parameters of the illumination optical unit at a location where the illumination optical unit is produced, calibration data of optical parameters of the light source at a location where the projection exposure apparatus is installed, calibration data of optical parameters of the illumination optical unit at a location where the projection exposure apparatus is installed, online measurement data of optical parameters of the light source, and online measurement data of optical parameters of the illumination optical unit;
- predefining an illumination channel-dependent evaluation function for evaluating a potential illumination channel group based on the illumination parameter;
- predefining an evaluation target range of evaluation variables based on the evaluation function; and
- selecting the illumination channels whose evaluation variable is within the evaluation target range, thereby assigning the pupil facet of the pupil facet mirror to the field facet of the field facet mirror so that, during use of the optical unit, the illumination channels are superimposed in the object field,
- wherein the method further comprises providing a data set which assigns data to each field point of the object field, wherein the data comprises: a distribution of the illumination angles which illuminate the field point and illumination intensities at the respective illumination angles.

2. The method of claim 1, further comprising predefining an arrangement of the pupil facets of the pupil facet mirror when selecting the illumination channels.

3. The method of claim 2, further comprising predefining an arrangement of the field facets of the field facet mirror when selecting the illumination channels.

4. The method of claim 2, further comprising:
- predefining groups of pupil facets of the pupil facet mirror onto which, proceeding from different field facets, the illumination light is deflectable to predefine an illumination angle distribution for an illumination of the object field; and
- assigning the field facets to the pupil facets while predefining arrangements of sets of the pupil facets which are assigned to different tilting positions of one and the same field facet so that exclusively pupil facets of different pupil facet sets are arranged in each pupil facet group.

5. The method of claim 1, further comprising predefining an arrangement of the field facets of the field facet mirror when selecting the illumination channels.

6. The method of claim 1, further comprising predefining an arrangement of the field facets of the field facet mirror when selecting the illumination channels.

7. The method of claim 1, further comprising:
- predefining groups of pupil facets of the pupil facet mirror onto which, proceeding from different field facets, the illumination light is deflectable to predefine an illumination angle distribution for an illumination of the object field; and
- assigning the field facets to the pupil facets while predefining arrangements of sets of the pupil facets which are assigned to different tilting positions of one and the same field facet so that exclusively pupil facets of different pupil facet sets are arranged in each pupil facet group.

8. The method of claim 1, further comprising using a weighted sum of an illumination intensity of the pupil facets within at least one pupil facet environment around at least one selected pupil facet for the evaluation function.

9. The method of claim 1, further comprising, to prepare for selecting the illumination channels, predefining radii of curvature for the pupil facets of the pupil facet mirror.

10. The method of claim 1, further comprising, to prepare for selecting the illumination channels, predefining a perpendicular position of the pupil facets relative to an arrangement plane of the pupil facets on a carrier plate of the pupil facet mirror.

11. The method of claim 1, further comprising predefining a set of tilting angles of the pupil facets which results from the illumination channel selecting.

12. The method of claim 1, further comprising predefining a set of tilting angles of the field facets which results from the illumination channel selecting.

13. The method of claim 1, wherein the data comprises:
- pupil facet sets determined via the assignment method;
- tilting data of tiltable field facets which, depending on tilting angle, guide a partial beam of the illumination light toward a predefined pupil facet, including the data concerning the set of those pupil facets to which the partial beam can be applied by means of the tilting angles of exactly one field facet;
- for each possibility of the tilting settings of the field facets, a distribution of illumination angles for each field point which illuminates the field point; and
- illumination intensities at the respective illumination angles.

14. The method of claim 1, further comprising, after assigning the pupil facet of the pupil facet mirror to the field facet of the field facet mirror, using the illumination optical unit to illuminate an object in the object field.

15. The method of claim 1, further comprising, before identifying an illumination parameter, characterizing an object structure to be imaged by the projection exposure apparatus.

16. The method of claim 1, further comprising:
- selecting an illumination setting for the illumination optical unit to illuminate the object field; and
- after assigning the pupil facet of the pupil facet mirror to the field facet of the field facet mirror, illuminating the object field with the illumination setting.

17. The method of claim 1, further comprising, before identifying an illumination parameter:
- characterizing an object structure to be imaged by the projection exposure apparatus; and
- based on the characterization of the object structure, selecting an illumination setting for the illumination optical unit to illuminate the object.

18. One or more non-transitory machine-readable storage devices storing instructions that are executable by one or more processing devices to perform operations comprising the method of claim 1.

19. A system comprising:
memory storing non-transitory instructions that are executable; and
one or more processing devices to execute the instruction to perform operations comprising the method of claim 1.

20. A method of assigning a pupil facet of a pupil facet mirror of an illumination optical unit of a projection exposure apparatus to a field facet of a field facet mirror of the illumination optical unit to define an illumination channel for a partial beam of illumination light, which proceeding from a light source that generates the illumination light, reflects from the field facet and the assigned pupil facet then toward an object field, the method comprising:
identifying an illumination parameter useable to evaluate an illumination of the object field;
determining a dependence of the illumination parameter on at least one parameter selected from the group consisting of design predefinition data of optical parameters of the light source, design predefinition data of optical parameters of the illumination optical unit, individual part acceptance data of optical parameters of the light source, individual part acceptance data of optical parameters of the illumination optical unit, total system acceptance data of optical parameters of the light source at a location at which the light source is produced, total system acceptance data of optical parameters of the illumination optical unit at a location where the illumination optical unit is produced, calibration data of optical parameters of the light source at a location where the projection exposure apparatus is installed, calibration data of optical parameters of the illumination optical unit at a location where the projection exposure apparatus is installed, online measurement data of optical parameters of the light source, and online measurement data of optical parameters of the illumination optical unit;
predefining an illumination channel-dependent evaluation function for evaluating a potential illumination channel group based on the illumination parameter;
predefining an evaluation target range of evaluation variables based on the evaluation function; and
selecting the illumination channels whose evaluation variable is within the evaluation target range, thereby assigning the pupil facet of the pupil facet mirror to the field facet of the field facet mirror,
wherein:
the method further comprises providing a data set which assigns data to each field point of the object field; and
the data comprises: a distribution of the illumination angles which illuminate the field point; and illumination intensities at the respective illumination angles.

21. A method of assigning a pupil facet of a pupil facet mirror of an illumination optical unit of a projection exposure apparatus to a field facet of a field facet mirror of the illumination optical unit to define an illumination channel for a partial beam of illumination light, which proceeding from a light source that generates the illumination light, reflects from the field facet and the assigned pupil facet then toward an object field, the method comprising:
identifying an illumination parameter useable to evaluate an illumination of the object field;
determining a dependence of the illumination parameter on at least one parameter selected from the group consisting of design predefinition data of optical parameters of the light source, design predefinition data of optical parameters of the illumination optical unit, individual part acceptance data of optical parameters of the light source, individual part acceptance data of optical parameters of the illumination optical unit, total system acceptance data of optical parameters of the light source at a location at which the light source is produced, total system acceptance data of optical parameters of the illumination optical unit at a location where the illumination optical unit is produced, calibration data of optical parameters of the light source at a location where the projection exposure apparatus is installed, calibration data of optical parameters of the illumination optical unit at a location where the projection exposure apparatus is installed, online measurement data of optical parameters of the light source, and online measurement data of optical parameters of the illumination optical unit;
predefining an illumination channel-dependent evaluation function for evaluating a potential illumination channel group based on the illumination parameter;
predefining an evaluation target range of evaluation variables based on the evaluation function; and
selecting the illumination channels whose evaluation variable is within the evaluation target range, thereby assigning the pupil facet of the pupil facet mirror to the field facet of the field facet mirror so that, during use of the optical unit, the illumination channels are superimposed in the object field,
wherein the method further comprises, to prepare for selecting the illumination channels, predefining radii of curvature for the pupil facets of the pupil facet mirror.

* * * * *

UNITED STATES PATENT AND TRADEMARK OFFICE
CERTIFICATE OF CORRECTION

PATENT NO. : 9,791,785 B2
APPLICATION NO. : 14/669761
DATED : October 17, 2017
INVENTOR(S) : Michael Patra It is certified that error appears in the above-identified patent and that said Letters Patent is hereby corrected as shown below:

In the Claims

Column 27, Line 44, Claim 1, after "point", insert -- ; --.

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*